US012793770B2

(12) United States Patent
Li

(10) Patent No.: US 12,793,770 B2
(45) Date of Patent: Nov. 10, 2026

(54) MEMORY UNIT HAVING A PADDING AREA SEPARATING TWO IO-FUNCTIONAL CIRCUITS EACH ASSOCIATED WITH AN ARRAYS OF BIT-CELLS

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventor: Haizhu Li, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 21 days.

(21) Appl. No.: 19/029,499

(22) Filed: Jan. 17, 2025

(65) Prior Publication Data

US 2026/0204312 A1 Jul. 16, 2026

(30) Foreign Application Priority Data

Jan. 10, 2025 (CN) ........................ 202510041741.2

(51) Int. Cl.
*G11C 11/419* (2006.01)
*G11C 5/06* (2006.01)

(52) U.S. Cl.
CPC ............ *G11C 11/419* (2013.01); *G11C 5/063* (2013.01)

(58) Field of Classification Search
CPC .............................. G11C 11/419; G11C 5/063
See application file for complete search history.

(56) References Cited

U.S. PATENT DOCUMENTS

| | | | | |
|---|---|---|---|---|
| 6,228,704 | B1 * | 5/2001 | Uchida | H10D 84/0181 257/E21.654 |
| 6,717,842 | B2 * | 4/2004 | Watanabe | G11C 11/419 365/230.01 |
| 2002/0014899 | A1 * | 2/2002 | Sasaki | H10D 84/903 257/E27.107 |
| 2002/0027256 | A1 | 3/2002 | Ishibashi et al. | |
| 2017/0287553 | A1 * | 10/2017 | Ishii | G11C 11/418 |

(Continued)

FOREIGN PATENT DOCUMENTS

| | | |
|---|---|---|
| CN | 113363212 | 9/2021 |
| TW | 202201655 | 1/2022 |
| TW | 202501301 | 1/2025 |

*Primary Examiner* — Khamdan N. Alrobaie
(74) *Attorney, Agent, or Firm* — Hauptman Ham, LLP

(57) ABSTRACT

A memory unit includes a first IO-functional circuit and a second IO-functional circuit separated by a padding area. Each of the first IO-functional circuit and the second IO-functional circuit is associated with an array of bit-cells. The first IO-functional circuit has transistors in a first group of first-type active-region structures and in a first group of second-type active-region structures. The second IO-functional circuit has transistors in a second group of first-type active-region structures and in a second group of second-type active-region structures. The padding area includes a third group of first-type active-region structures which is adjacent to the first group of first-type active-region structures and adjacent to the second group of first-type active-region structures.

20 Claims, 20 Drawing Sheets

(56) References Cited

U.S. PATENT DOCUMENTS

| | | | | |
|---|---|---|---|---|
| 2019/0204368 | A1* | 7/2019 | Chang | G06F 1/266 |
| 2020/0082885 | A1* | 3/2020 | Lin | G11C 11/161 |
| 2021/0104551 | A1* | 4/2021 | Lin | G06N 3/065 |
| 2023/0095330 | A1* | 3/2023 | Lee | G11C 11/418<br>365/154 |

* cited by examiner

MEMORY UNIT HAVING A PADDING AREA SEPARATING TWO IO-FUNCTIONAL CIRCUITS EACH ASSOCIATED WITH AN ARRAYS OF BIT-CELLS

PRIORITY CLAIM

This application claims priority to Chinese Application No. 202510041741.2, filed Jan. 10, 2025, which is incorporated by reference herein in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize, and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
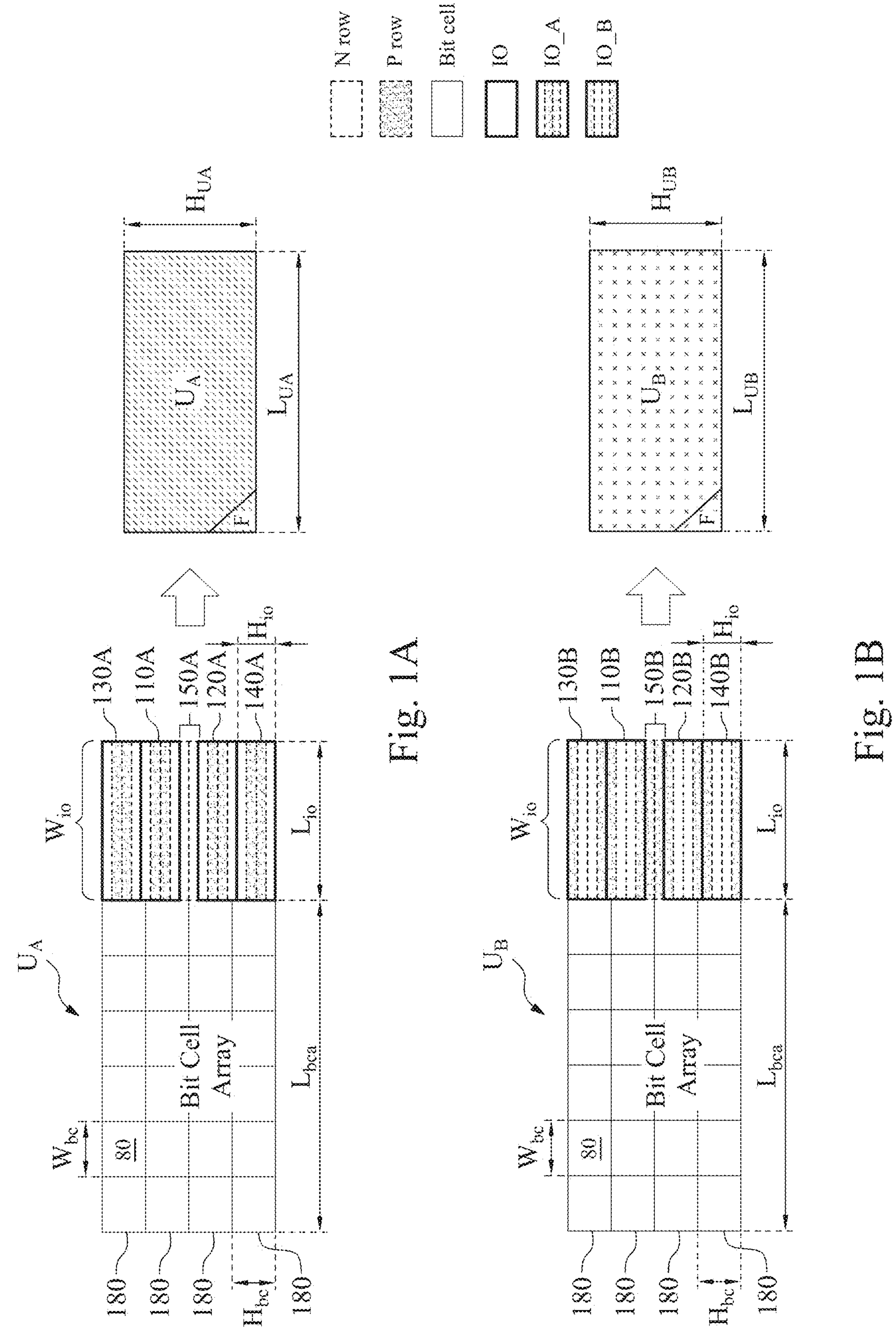
FIGS. 1A-1B are schematics of memory units, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a memory storage device includes multiple memory units. Each memory unit includes multiple arrays of bit-cells and multiple IO-functional circuits. Each array of bit-cells forms a row of bit-cells aligned with an IO-functional circuit along an X-direction. Each bit-cell in the array of bit-cells is connected to the IO-functional circuit through one or more conducting lines extending along the X-direction. The array of bit-cells has a height along a Y-direction. Each of the multiple IO-functional circuits has a height which is smaller than a height of the array of bit-cells.

In each memory unit, a padding area separates a first IO-functional circuit and a second IO-functional circuit along the Y-direction. The first IO-functional circuit is implemented with first-type transistors (e.g., NMOS transistors) in a first group of first-type active-region structures and second-type transistors (e.g., PMOS transistors) in a first group of second-type active-region structures. The second IO-functional circuit is implemented with first-type transistors (e.g., NMOS transistors) in a second group of first-type active-region structures and second-type transistors (e.g., PMOS transistors) in a second group of second-type active-region structures. The padding area is implemented with a third group of first-type active-region structures (which have no NMOS transistors therein in accordance with some specific embodiments). Additionally, the third group of first-type active-region structures is adjacent to a first-type active-region structure in the first group of first-type active-region structures and adjacent to a first-type active-region structure in the second group of first-type active-region structures.

FIGS. 1A-1B are schematics of memory units, in accordance with some embodiments. Each of the memory units $U_A$ and $U_B$ occupies a rectangular area in an integrated circuit. The rectangular area associated with the memory unit $U_A$ in FIG. 1A has a height $H_{UA}$ extending in the Y-direction and a length $L_{UA}$ extending in the X-direction. The rectangular area associated with the memory unit $U_B$ in FIG. 1B has a height $H_{UB}$ extending in the Y-direction and a length $L_{UB}$ extending in the X-direction. The X-direction and Y-direction are perpendicular to each other.

In FIGS. 1A-1B, each of the memory units $U_A$ and $U_B$ includes multiple IO-functional circuits (such as, 110A-140A in FIG. 1A or 110B-140B in FIG. 1B) in a first circuit region arranged along the Y-direction and multiple arrays of bit-cells (such as, four arrays of bit-cells 180 in the figure) arranged along the Y-direction in a second circuit region. Each of the multiple IO-functional circuits has the same layouts. The number of IO-functional circuits in a memory unit ($U_A$ or $U_B$) is equal to the number of the arrays of bit-cells in the memory unit, because each of the IO-functional circuits is associated with one corresponding array of bit-cells and configured to transmit or receive signals from the corresponding array of bit-cells.

Each of the multiple IO-functional circuits has a width $W_{io}$ extending in the X-direction and a height $H_{io}$ extending in the Y-direction. Each of the arrays of bit-cells in the memory unit (i.e., $U_A$ or $U_B$) includes an array of bit-cells arranged along the X-direction. Each bit-cell (e.g. 80) has a width $W_{bc}$ extending in the X-direction and a height $H_{bc}$ extending in the Y-direction. In the memory unit (i.e., $U_A$ or $U_B$), the height $H_{io}$ of an IO-functional circuit is less than the height $H_{bc}$ of an array of bit-cells.

The length of $L_{io}$ the first circuit region containing the multiple IO-functional circuits is determined by the width $W_{io}$ of the circuit cell containing the IO-functional circuit. The length of $L_{bca}$ of the second circuit region containing the multiple arrays of bit-cells is related to the number of bit-cells in an array and the width $W_{bc}$ of the bit-cell 80. In the example of FIGS. 1A-1B, the length of $L_{bca}$ is equal to $6*W_{bc}$, because there are six bit-cells in each array of bit-cells of the memory unit.

In this disclosure, the bit-cell in an array of bit-cells is broadly defined. In some embodiments, the bit-cell is a static random-access memory cell (i.e., a SRAM cell). In some embodiments, the bit-cell includes two SRAM cells arranged along the Y-direction, and consequently, the width $W_{bc}$ of the bit-cell is equal to the width of one SRAM cell while the height $H_{bc}$ of the bit-cell is two times the height of one SRAM cell. In some embodiments, the bit-cell includes two SRAM cells arranged along the X-direction, and consequently, the width $W_{bc}$ of the bit-cell is two times the width of one SRAM cell while the height $H_{bc}$ of the bit-cell is equal to the height of one SRAM cell. In some embodiments, the bit-cell includes four SRAM cells arranged in a two by tow matrix, and consequently, the width $W_{bc}$ of the bit-cell is two times the width of one SRAM cell while the height $H_{bc}$ of the bit-cell is two times the height of one SRAM cell. Example implementations of SRAM cells, classified based on number of transistors, include four-transistor SRAM cells, six-transistor SRAM cells, eight-transistor SRAM cells, and ten-transistor SRAM cells. Example implementations of SRAM cells, classified based on number of ports, include one-port SRAM cells and dual-port SRAM cells. In the examples above, depending upon specific implementations, a bit-cell is operable to store one or more bits of information, for the reason that a specific implementation of the bit-cell includes one or more SRAM cells. Additionally, SRAM cells are provided as example implementations of a bit-cell, other implementations of a bit-cell having other type of memory cells are within the contemplated scope of present disclosure.

In FIGS. 1A-1B, the height of the memory unit (such as the height $H_{UA}$ or the height $H_{UB}$) is related to the number of arrays of bit-cells in the memory unit and the height $H_{bc}$ of the bit-cell. In the example of FIGS. 1A-1B, there are four arrays of bit-cells in a memory unit, and consequently the height of the memory unit ($H_{UA}$ or $H_{UB}$) is four times the height $H_{bc}$ of the bit-cell.

In FIGS. 1A-1B, because the height $H_{io}$ of an IO-functional circuit is less than the height $H_{bc}$ of an array of bit-cells and the number of IO-functional circuits is equal to the number of the arrays of bit-cells in the memory unit, a padding area (150A or 150B) is added in the first circuit region. Specifically, in FIG. 1A, the padding area 150A is added in the first circuit region between the IO-functional circuit 110A and the IO-functional circuit 120A. In FIG. 1B, the padding area 150B is added in the first circuit region between the IO-functional circuit 110B and the IO-functional circuit 120B. The padding area and the IO-functional circuits in the memory unit $U_A$ of FIG. 1A are depicted in more detail in the schematic of FIG. 2A. The padding area and the IO-functional circuits in the memory unit $U_B$ of FIG. 1B are depicted in more detail in the schematic of FIG. 2B.

Figure 2A:
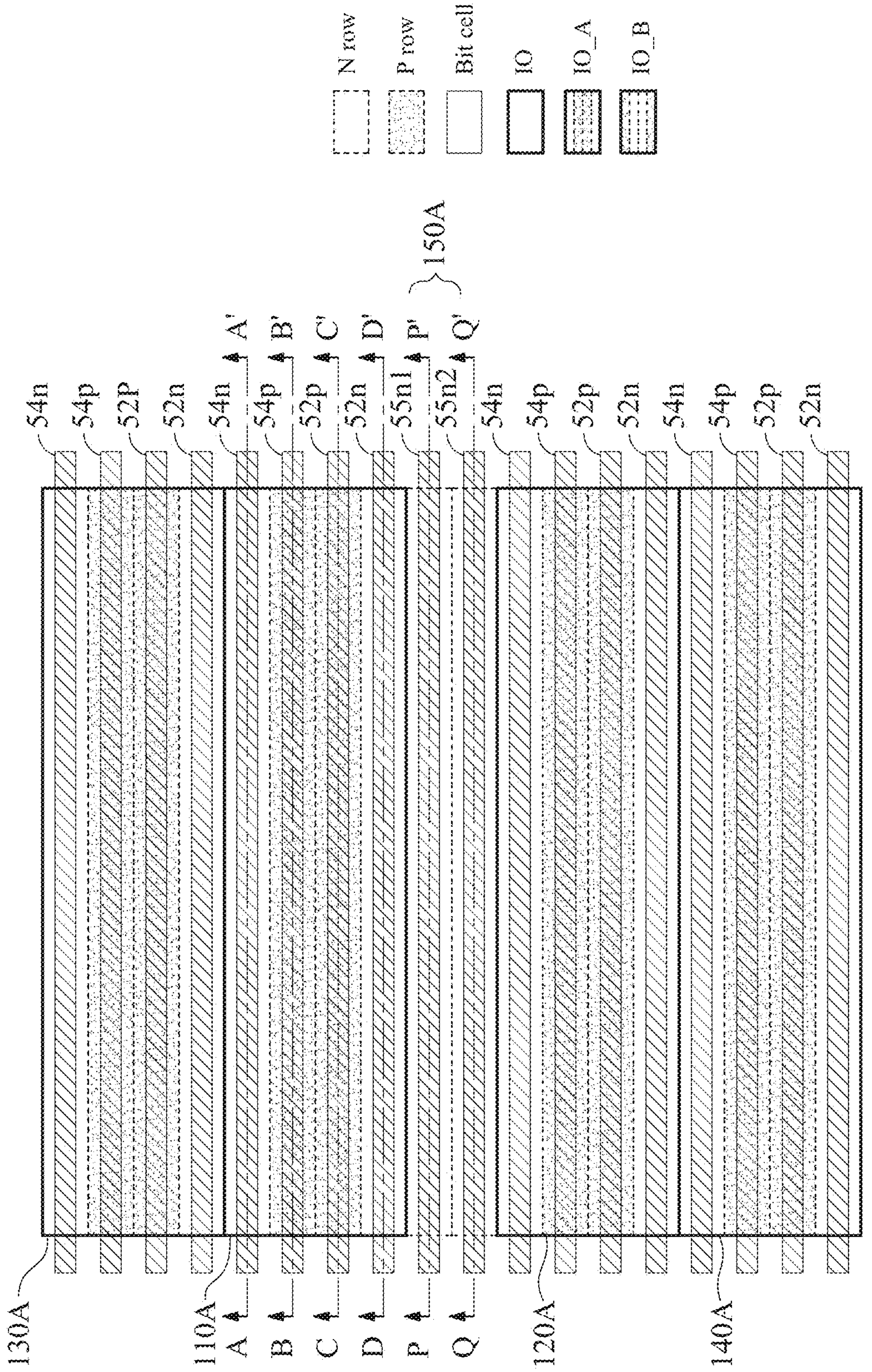
FIGS. 2A-2B are schematics of IO-functional circuits in the memory units of FIGS. 1A-1B, in accordance with some embodiments.

In FIG. 2A, each of the IO-functional circuits 110A-140A includes two PMOS active-region structures 52*p* and 54*p* extending in the X-direction and two NMOS active-region structures 52*n* and 54*n* extending in the X-direction. The two PMOS active-region structures 52*p* and 54*p* are arranged between two NMOS active-region structures 52*n* and 54*n*. The padding area 150A includes two NMOS active-region structures 55*n*1 and 55*n*2 extending in the X-direction. The NMOS active-region structures 55*n*1 is adjacent to the NMOS active-region structure 52*n* of the IO-functional circuit 110A, and the NMOS active-region structures 55*n*2 is adjacent to the NMOS active-region structure 54*n* of the IO-functional circuit 120A. As examples, a cross-sectional view for each of the NMOS active-region structures (i.e., 52*n* and 54*n*) and the PMOS active-region structures (i.e., 52*p* and 54*p*) in the IO-functional circuits 110A is shown in one of figures in FIGS. 3A-3D, and a cross-sectional view for each of the NMOS active-region structures (i.e., 55*n*1 and 55*n*2) in the padding area 150A is shown in one of figures in FIGS. 3E-3F. Each of the cross-sectional views in FIGS. 3A-3F is alone one of the cutting plane AA', BB', CC', DD', PP', and QQ' as identified in FIG. 2A.

In FIG. 2A, the NMOS transistors in each of the IO-functional circuits 110A-140A are implemented either in the NMOS active-region structure 52*n* or in the NMOS active-region structure 54*n*. The PMOS transistors in each of the IO-functional circuits 110A-140A are implemented either in the PMOS active-region structure 52*p* or in the PMOS active-region structure 54*p*. In some embodiments, each of the two NMOS active-region structures 55*n*1 and 55*n*2 within the padding area 150A is a dummy active-region structure which contains no functioning transistors. In some embodiments, one or more of the two NMOS active-region structures 55*n*1 and 55*n*2 are implemented with NMOS transistors which are not used to support the operation of any of the IO-functional circuits 110A-140A and any of the bit-cells in the memory unit $U_A$. In some embodiments, one or more of the two NMOS active-region structures 55*n*1 and 55*n*2 in the padding area 150 are implemented with NMOS transistors, and at least one of the NMOS transistors in the padding area 150 is used as a header switch or as a footer switch for some of the IO-functional circuits 110A-140A or for some of the bit-cells in the memory unit $U_A$.

A header switch for an IO-functional circuit is a FET switch connected between an upper power supply (such as VDD) and the IO-functional circuit. In response to the header switch being set to a connecting state, the upper power supply is applied to the IO-functional circuit. In response to the header switch being set to a disconnecting state, the IO-functional circuit is decoupled from the upper power supply. A footer switch for an IO-functional circuit is a FET switch connected between a lower power supply (such as VSS) and the IO-functional circuit. In response to the footer switch being set to a connecting state, the lower power supply is applied to the IO-functional circuit. In response to the footer switch being set to a disconnecting state, the IO-functional circuit is decoupled from the lower power supply.

Figure 2B:
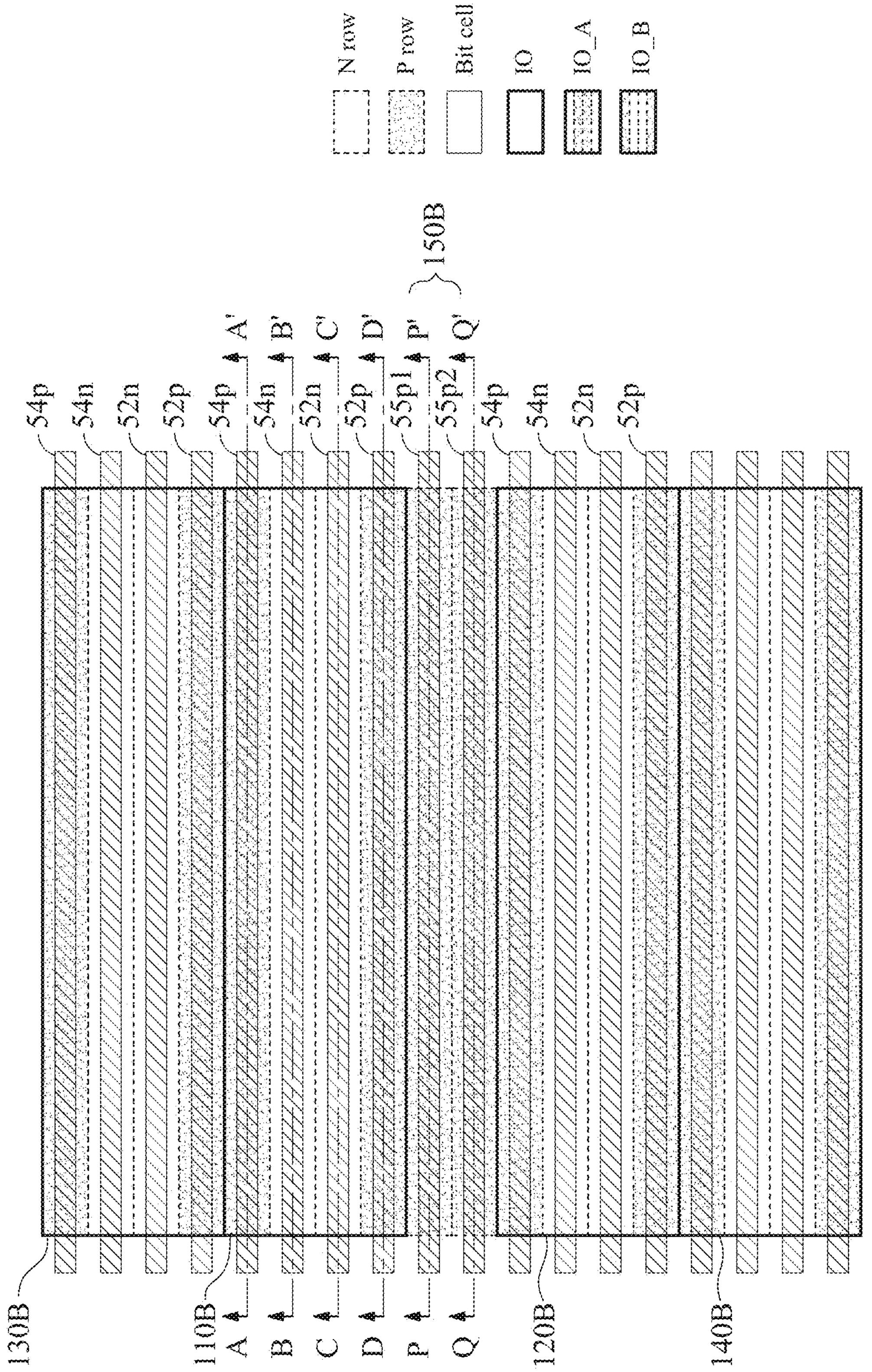

In FIG. 2B, each of the IO-functional circuits 110B-140B includes two PMOS active-region structures 52*p* and 54*p* extending in the X-direction and two NMOS active-region structures 52*n* and 54*n* extending in the X-direction. The two NMOS active-region structures 52*n* and 54*n* are arranged between two PMOS active-region structures 52*p* and 54*p*. The padding area 150B includes two PMOS active-region structures 55*p*1 and 55*p*2 extending in the X-direction. The PMOS active-region structures 55*p*1 is adjacent to the PMOS active-region structure 52*p* of the IO-functional circuit 110B, and the PMOS active-region structures 55*p*2 is adjacent to the PMOS active-region structure 54*p* of the IO-functional circuit 120B. As examples, a cross-sectional view for each of the NMOS active-region structures (i.e., 52*n* and 54*n*) and the PMOS active-region structures in the IO-functional circuits 110B (i.e., 52*p* and 54*p*) is shown in one of figures in FIGS. 5A-5D, and a cross-sectional view for each of the PMOS active-region structures (i.e., 55*p*1 and 55*p*2) in the padding area 150B is shown in one of figures in FIGS. 5E-5F. Each of the cross-sectional views in FIGS. 5A-5F is alone one of the cutting plane AA', BB', CC', DD', PP', and QQ' as identified in FIG. 2B.

In FIG. 2B, the NMOS transistors in each of the IO-functional circuits 110B-140B are implemented either in the NMOS active-region structure 52*n* or in the NMOS active-region structure 54*n*. The PMOS transistors in each of the IO-functional circuits 110B-140B are implemented either in the PMOS active-region structure 52*p* or in the PMOS active-region structure 54*p*. In some embodiments, each of the two PMOS active-region structures 55*p*1 and 55*p*2 within the padding area 150B is a dummy active-region structure which contains no functioning transistors. In some embodiments, one or more of the two PMOS active-region structures 55*p*1 and 55*p*2 are implemented with PMOS transistors which are not used to support the operation of any of the IO-functional circuits 110B-140B and any of the bit-cells in the memory unit $U_B$. In some embodiments, one or more of the two PMOS active-region structures 55*p*1 and 55*p*2 are implemented with PMOS transistors, and at least one of the PMOS transistors in the padding area 150B is used as a header switch or as a footer switch for some of the IO-functional circuits 110B-140B or for some of the bit-cells in the memory unit $U_B$.

In FIGS. 1A-1B and FIGS. 2A-2B, various implementations of the active-region structures and various implementations of the transistors in a memory unit are within the scope of present disclosure. In some embodiments, each of the NMOS active-region structures (i.e., 52*n* and 54*n*) and the PMOS active-region structures (i.e., 52*p* and 54*p*) includes one or more fin structures, and consequently, the NMOS transistors and the PMOS transistors implemented with the active-region structures are finFET transistors. In some embodiments, each of the NMOS active-region structures (i.e., 52*n* and 54*n*) and the PMOS active-region structures (i.e., 52*p* and 54*p*) includes one or more nano-sheets, and consequently, the NMOS transistors and the PMOS transistors implemented with the active-region structures are nano-sheet transistors. In some embodiments, each of the NMOS active-region structures (i.e., 52*n* and 54*n*) and the PMOS active-region structures (i.e., 52*p* and 54*p*) includes one or more nano-wires, and consequently, the NMOS transistors and the PMOS transistors implemented with the active-region structures are nano-wire transistors.

In some embodiments of the memory unit $U_A$ in which the NMOS transistors are implemented in the padding area 150A, the kinds of the NMOS transistors implemented depend upon the kinds of the NMOS active-region structures supporting the NMOS transistors. Examples of the NMOS transistors implemented in the NMOS active-region structures 55*n*1 and 55*n*2 of the padding area 150A include finFET transistors, nano-sheet transistors, and nano-wire transistors. In some embodiments of the memory unit $U_B$ in which the PMOS transistors are implemented in the padding area 150B, the kinds of the PMOS transistors implemented depend upon the kinds of the PMOS active-region structures supporting the PMOS transistors. Examples of the PMOS transistors implemented in the PMOS active-region structures 55*p*1 and 55*p*2 of the padding area 150B include finFET transistors, nano-sheet transistors, and nano-wire transistors.

Figure 3A:
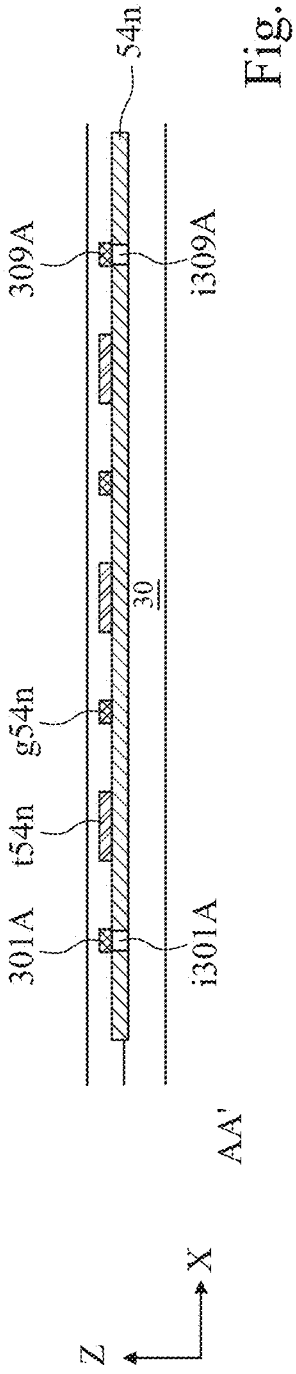
FIGS. 3A-3F are cross-sectional views of the device in FIG. 2A, in accordance with some embodiments.

FIGS. 3A-3F are cross-sectional views of the device in FIG. 2A, which is a part of the memory unit $U_A$ of FIG. 1A, along various cutting planes, in accordance with some embodiments. In FIG. 3A, which is the cross-sectional view along the cutting plane AA' of FIG. 2A, the NMOS active-region structure 54*n* is on the substrate 30. Various gate-conductors (e.g., g54*n*) intersect the NMOS active-region structure 54*n*, and at least one of the gate-conductors forms a gate terminal of an NMOS transistor. Various terminal-conductors (e.g., t54*n*) intersect the NMOS active-region structure 54*n*, and at least one of the terminal-conductors forms a source terminal or a drain terminal of an NMOS transistor. In some embodiments, the active regions (such as, the channel region under a gate terminal, and the source region or the drain region under a source terminal) in the NMOS active-region structure 54*n* are isolated from the active regions in the adjacent circuit cells by a boundary isolation region i301A under a dummy gate-conductor 301A and a boundary isolation region i309A under a dummy gate-conductor 309A.

Figure 3B:
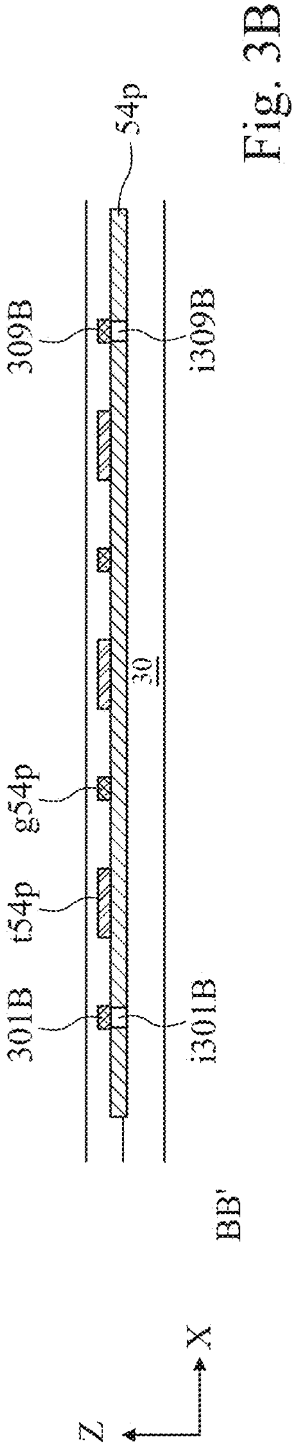

In FIG. 3B, which is the cross-sectional view along the cutting plane BB' of FIG. 2A, the PMOS active-region structure 54*p* is on the substrate 30. Various gate-conductors (e.g., g54*p*) intersect the PMOS active-region structure 54*p*, and at least one of the gate-conductors forms a gate terminal of a PMOS transistor. Various terminal-conductors (e.g., t54*p*) intersect the PMOS active-region structure 54*p*, and at least one of the terminal-conductors forms a source terminal or a drain terminal of a PMOS transistor. In some embodiments, the active regions (such as, channel regions, source regions, or drain regions) in the PMOS active-region structure 54*p* are isolated from the active regions in the adjacent circuit cells by a boundary isolation region i301B under a dummy gate-conductor 301B and a boundary isolation region i309B under a dummy gate-conductor 309B.

Figure 3C:
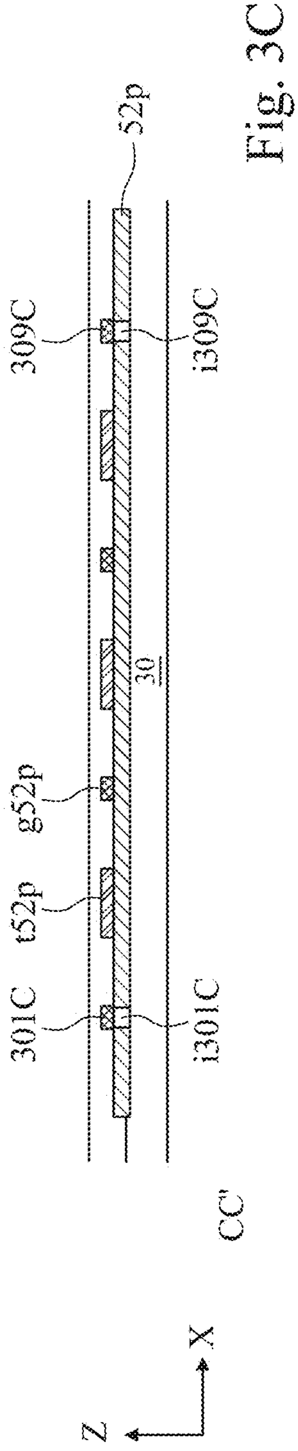

In FIG. 3C, which is the cross-sectional view along the cutting plane CC' of FIG. 2A, the PMOS active-region structure 52*p* is on the substrate 30. Various gate-conductors (e.g., g52*p*) intersect the PMOS active-region structure 52*p*, and at least one of the gate-conductors forms a gate terminal of a PMOS transistor. Various terminal-conductors (e.g., t52*p*) intersect the PMOS active-region structure 52*p*, and at least one of the terminal-conductors forms a source terminal or a drain terminal of a PMOS transistor. In some embodiments, the active regions (such as, channel regions, source regions, or drain regions) in the PMOS active-region structure 52*p* are isolated from the active regions in the adjacent circuit cells by a boundary isolation region i301C under a dummy gate-conductor 301C and a boundary isolation region i309C under a dummy gate-conductor 309C.

Figure 3D:
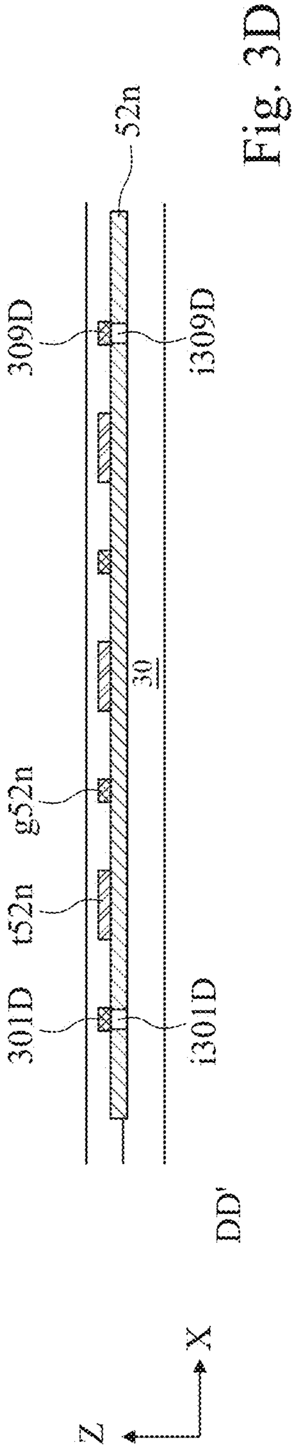

In FIG. 3D, which is the cross-sectional view along the cutting plane DD' of FIG. 2A, the NMOS active-region structure 52*n* is on the substrate 30. Various gate-conductors (e.g., g52*n*) intersect the NMOS active-region structure 52*n*, and at least one of the gate-conductors forms a gate terminal of an NMOS transistor. Various terminal-conductors (e.g., t52*n*) intersect the NMOS active-region structure 52*n*, and at least one of the terminal-conductors forms a source terminal or a drain terminal of an NMOS transistor. In some embodiments, the active regions (such as, channel regions, source regions, or drain regions) in the NMOS active-region structure 52*n* are isolated from the active regions in the adjacent circuit cells by a boundary isolation region i301D under a dummy gate-conductor 301D and a boundary isolation region i309D under a dummy gate-conductor 309D.

Figure 3E:
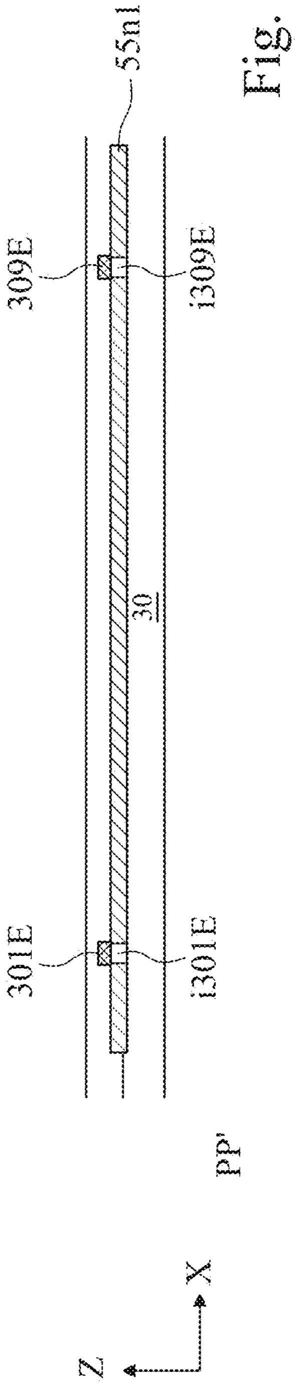

In FIG. 3E, which is the cross-sectional view along the cutting plane PP' of FIG. 2A, the NMOS active-region structure 55*n*1 is on the substrate 30. There are no transistors implemented in the NMOS active-region structure 55*n*1 between a boundary isolation region i301E and a boundary isolation region i309E. The boundary isolation region i301E is under a dummy gate-conductor 301E and the boundary isolation region i309E is under a dummy gate-conductor 309E. In some embodiments, the boundary isolation region i301E and the boundary isolation region i309E are not implemented in the NMOS active-region structure 55*n*1 at the boundaries of the first circuit region containing the IO-functional circuits. In addition, in some embodiments, the dummy gate-conductor 301E and the dummy gate-conductor 309E are also not implemented at the boundaries.

Figure 3F:
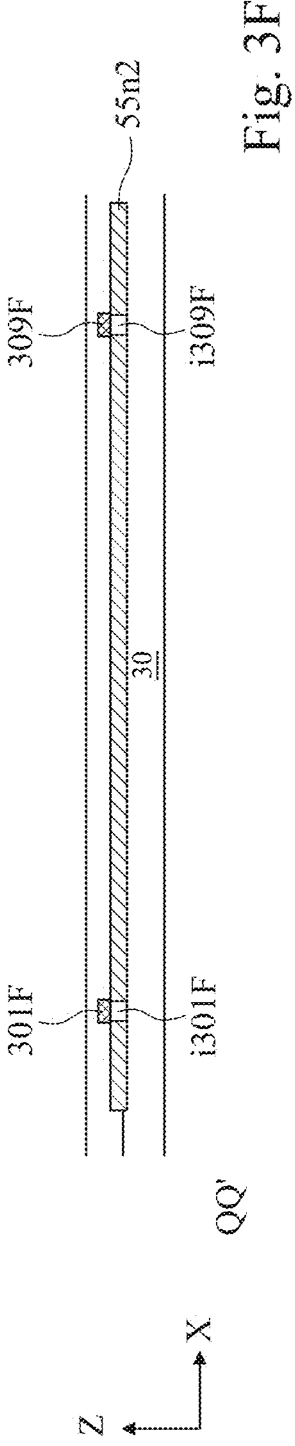

In FIG. 3F, which is the cross-sectional view along the cutting plane QQ' of FIG. 2A, the NMOS active-region structure 55*n*2 is on the substrate 30. There are no transistors implemented in the NMOS active-region structure 55*n*2 between a boundary isolation region i301F and a boundary isolation region i309F. The boundary isolation region i301F is under a dummy gate-conductor 301F and the boundary isolation region i309F is under a dummy gate-conductor 309F. In some embodiments, the boundary isolation region i301F and the boundary isolation region i309F are not implemented in the NMOS active-region structure 55*n*2 at the boundaries of the first circuit region containing the IO-functional circuits. In addition, in some embodiments, the dummy gate-conductor 301F and the dummy gate-conductor 309F are also not implemented at the boundaries.

Figure 4A:
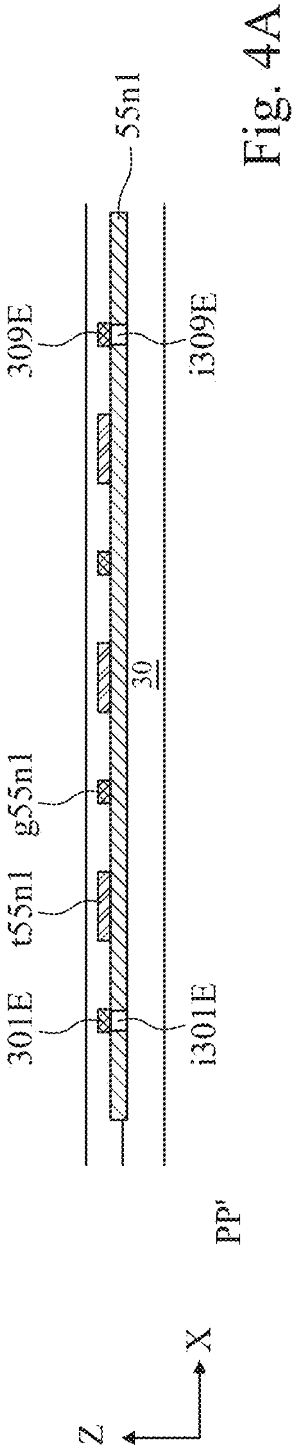
FIGS. 4A-4B are cross-sectional views of the NMOS active-region structures in the padding area of the device in FIG. 2A, in accordance with some embodiments.
Figure 4B:
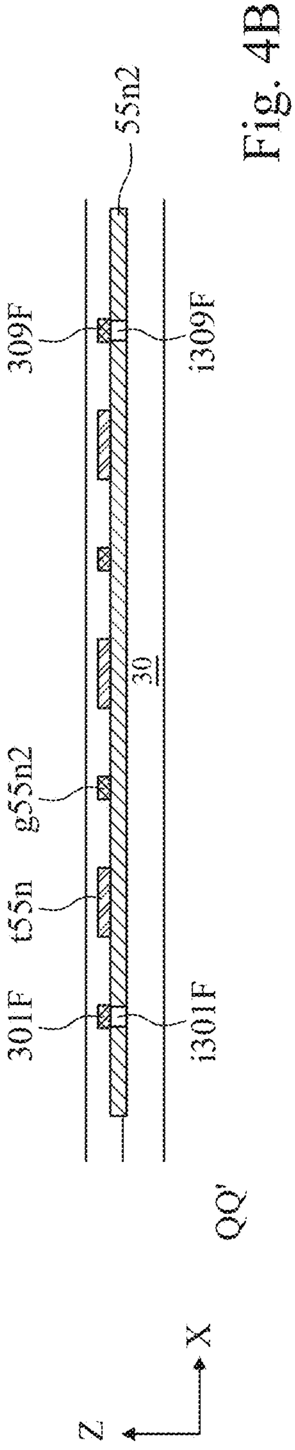

In the embodiments as shown in FIGS. 3E-3F, transistors are not implemented in the NMOS active-region structure 55*n*1 and the NMOS active-region structure 55*n*2 within the first circuit region containing the IO-functional circuits. In some alternative embodiments, as shown in FIGS. 4A-4B, NMOS transistors are implemented in the NMOS active-region structure 55*n*1 and the NMOS active-region structure 55*n*2 within the first circuit region. In some embodiments, at least some of the NMOS transistors in the NMOS active-region structure 55*n*1 and the NMOS active-region structure 55*n*2 are used as header switches or footer switches for some of the IO-functional circuits 110A-140A. In some embodiments, at least some of the NMOS transistors in the NMOS active-region structure 55*n*1 and the NMOS active-region structure 55*n*2 are used as header switches or footer switches for some of the bit-cells in the memory unit UA.

In FIG. 4A, which is the cross-sectional view along the cutting plane PP' of FIG. 2A, the NMOS active-region structure 55*n*1 is on the substrate 30. Various gate-conductors (e.g., g55*n*1) intersect the NMOS active-region structure 55*n*1, and at least one of the gate-conductors forms a gate terminal of an NMOS transistor. Various terminal-conductors (e.g., t55*n*1) intersect the NMOS active-region structure 55*n*1, and at least one of the terminal-conductors forms a source terminal or a drain terminal of an NMOS transistor. In some embodiments, the active regions in the NMOS active-region structure 55*n*1 are isolated from the active regions in the adjacent circuit cells by a boundary isolation region i301E under a dummy gate-conductor 301E and a boundary isolation region i309E under a dummy gate-conductor 309E.

In FIG. 4B, which is the cross-sectional view along the cutting plane QQ' of FIG. 2A, the NMOS active-region structure 55*n*2 is on the substrate 30. Various gate-conductors (e.g., g55*n*2) intersect the NMOS active-region structure 55*n*2, and at least one of the gate-conductors forms a gate terminal of an NMOS transistor. Various terminal-conductors (e.g., t55*n*2) intersect the NMOS active-region structure 55*n*2, and at least one of the terminal-conductors forms a source terminal or a drain terminal of an NMOS transistor. In some embodiments, the active regions in the NMOS active-region structure 55*n*2 are isolated from the active regions in the adjacent circuit cells by a boundary isolation region i301F under a dummy gate-conductor 301F and a boundary isolation region i309F under a dummy gate-conductor 309F.

Figure 5A:
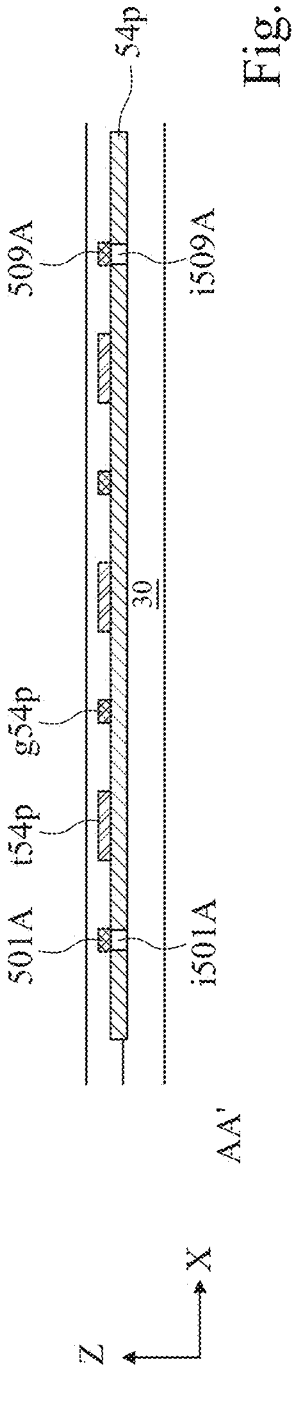
FIGS. 5A-5F are cross-sectional views of the device in FIG. 2B, in accordance with some embodiments.

FIGS. 5A-5F are cross-sectional views of the device in FIG. 2B, which is a part of the memory unit $U_B$ of FIG. 1B, along various cutting planes, in accordance with some embodiments. In FIG. 5A, which is the cross-sectional view along the cutting plane AA' of FIG. 2B, the PMOS active-region structure 54*p* is on the substrate 30. Various gate-conductors (e.g., g54*p*) intersect the PMOS active-region structure 54*p*, and at least one of the gate-conductors forms a gate terminal of a PMOS transistor. Various terminal-conductors (e.g., t54*p*) intersect the PMOS active-region structure 54*p*, and at least one of the terminal-conductors forms a source terminal or a drain terminal of a PMOS transistor. In some embodiments, the active regions in the PMOS active-region structure 54*p* are isolated from the active regions in the adjacent circuit cells by a boundary isolation region i501B under a dummy gate-conductor 501B and a boundary isolation region i509B under a dummy gate-conductor 509B.

Figure 5B:
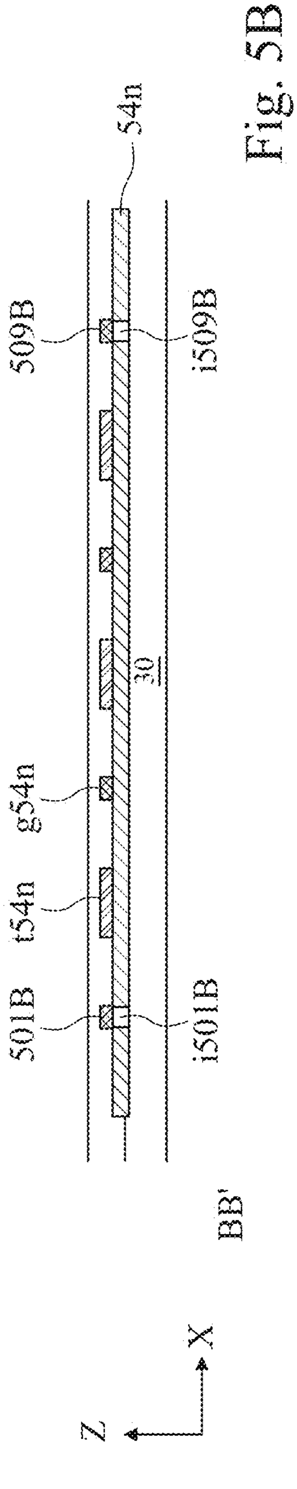

In FIG. 5B, which is the cross-sectional view along the cutting plane BB' of FIG. 2B, the NMOS active-region structure 54*n* is on the substrate 30. Various gate-conductors (e.g., g54*n*) intersect the NMOS active-region structure 54*n*, and at least one of the gate-conductors forms a gate terminal of an NMOS transistor. Various terminal-conductors (e.g., t54*n*) intersect the NMOS active-region structure 54*n*, and at least one of the terminal-conductors forms a source terminal or a drain terminal of an NMOS transistor. In some embodiments, the active regions in the NMOS active-region structure 54*n* are isolated from the active regions in the adjacent circuit cells by a boundary isolation region i501B under a dummy gate-conductor 501B and a boundary isolation region i509B under a dummy gate-conductor 509B.

Figure 5C:
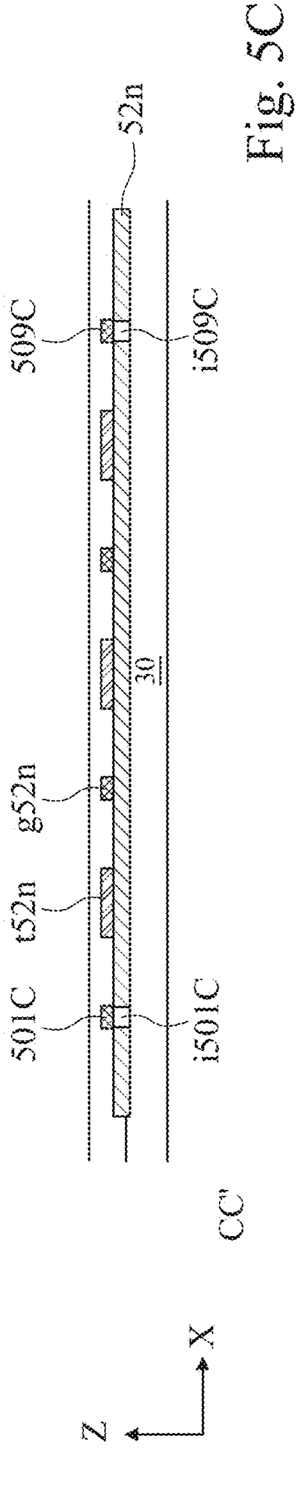

In FIG. 5C, which is the cross-sectional view along the cutting plane CC' of FIG. 2B, the NMOS active-region structure 52*n* is on the substrate 30. Various gate-conductors (e.g., g52*n*) intersect the NMOS active-region structure 52*n*, and at least one of the gate-conductors forms a gate terminal of an NMOS transistor. Various terminal-conductors (e.g., t52*n*) intersect the NMOS active-region structure 52*n*, and at least one of the terminal-conductors forms a source terminal or a drain terminal of an NMOS transistor. In some embodiments, the active regions in the NMOS active-region structure 52*n* are isolated from the active regions in the adjacent circuit cells by a boundary isolation region i501C under a dummy gate-conductor 501C and a boundary isolation region i509C under a dummy gate-conductor 509C.

Figure 5D:
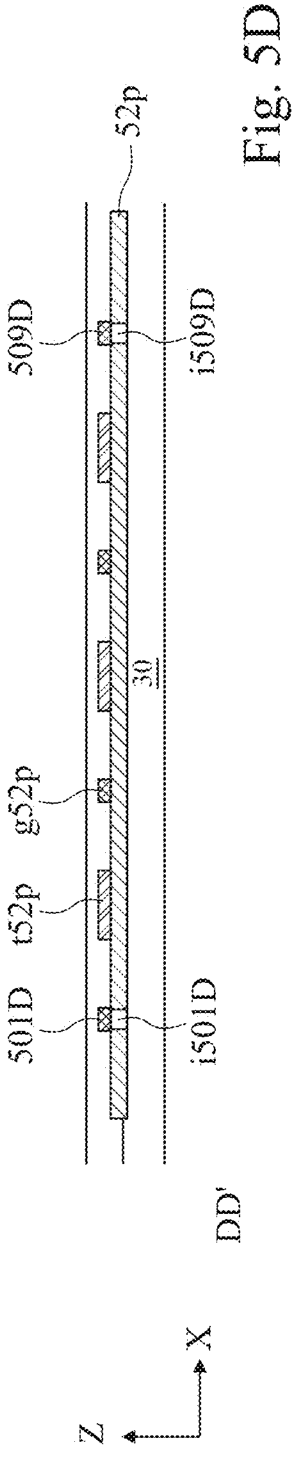

In FIG. 5D, which is the cross-sectional view along the cutting plane DD' of FIG. 2B, the PMOS active-region structure 52*p* is on the substrate 30. Various gate-conductors (e.g., g52*p*) intersect the PMOS active-region structure 52*p*, and at least one of the gate-conductors forms a gate terminal of a PMOS transistor. Various terminal-conductors (e.g., t52*p*) intersect the PMOS active-region structure 52*p*, and at least one of the terminal-conductors forms a source terminal or a drain terminal of a PMOS transistor. In some embodiments, the active regions in the PMOS active-region structure 52*p* are isolated from the active regions in the adjacent circuit cells by a boundary isolation region i501D under a dummy gate-conductor 501D and a boundary isolation region i509D under a dummy gate-conductor 509D.

Figure 5E:
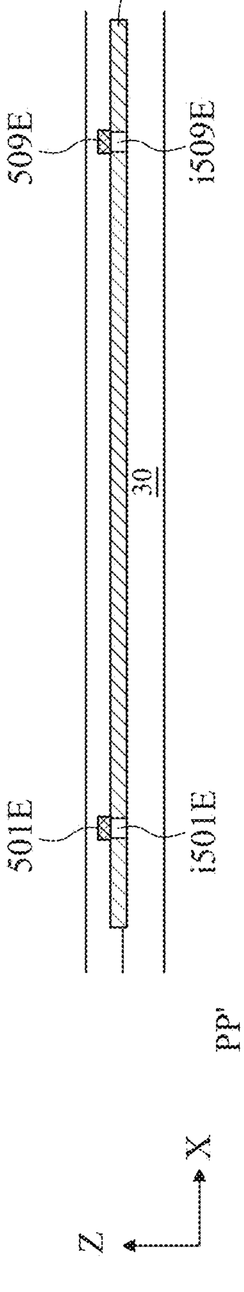

In FIG. 5E, which is the cross-sectional view along the cutting plane PP' of FIG. 2B, the PMOS active-region structure 55*p*1 is on the substrate 30. There are no transistors implemented in the PMOS active-region structure 55*p*1 between a boundary isolation region i501E and a boundary isolation region i509E. The boundary isolation region i501E is under a dummy gate-conductor 501E and the boundary isolation region i509E is under a dummy gate-conductor 509E. In some embodiments, the boundary isolation region i501E and the boundary isolation region i509E are not implemented in the PMOS active-region structure 55*p*1 at the boundaries of the first circuit region containing the IO-functional circuits. In addition, in some embodiments, the dummy gate-conductor 501E and the dummy gate-conductor 509E are also not implemented at the boundaries.

Figure 5F:
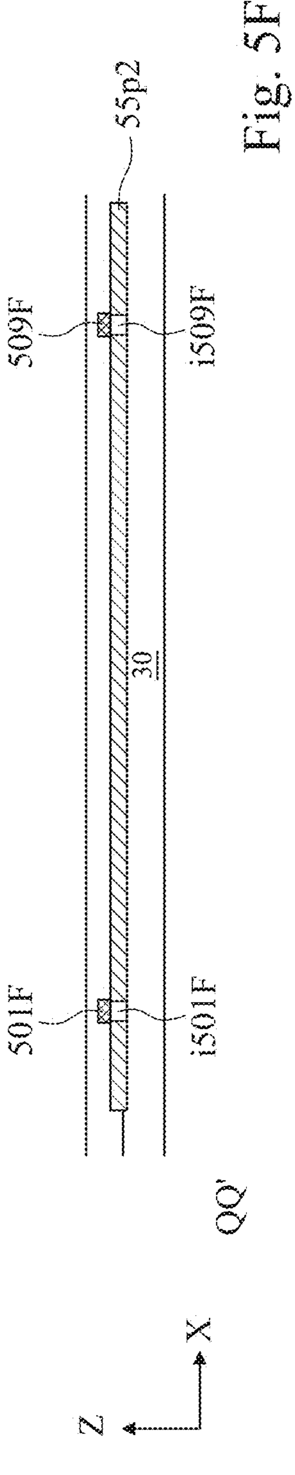

In FIG. 5F, which is the cross-sectional view along the cutting plane QQ' of FIG. 2B, the PMOS active-region structure 55*p*2 is on the substrate 30. There are no transistors implemented in the PMOS active-region structure 55*p*2 between a boundary isolation region i501F and a boundary isolation region i509F. The boundary isolation region i501F is under a dummy gate-conductor 501F and the boundary isolation region i509F is under a dummy gate-conductor 509F. In some embodiments, the boundary isolation region i501F and the boundary isolation region i509F are not implemented in the PMOS active-region structure 55*p*2 at the boundaries of the first circuit region containing the IO-functional circuits. In addition, in some embodiments, the dummy gate-conductor 501F and the dummy gate-conductor 509F are also not implemented at the boundaries.

Figure 6A:
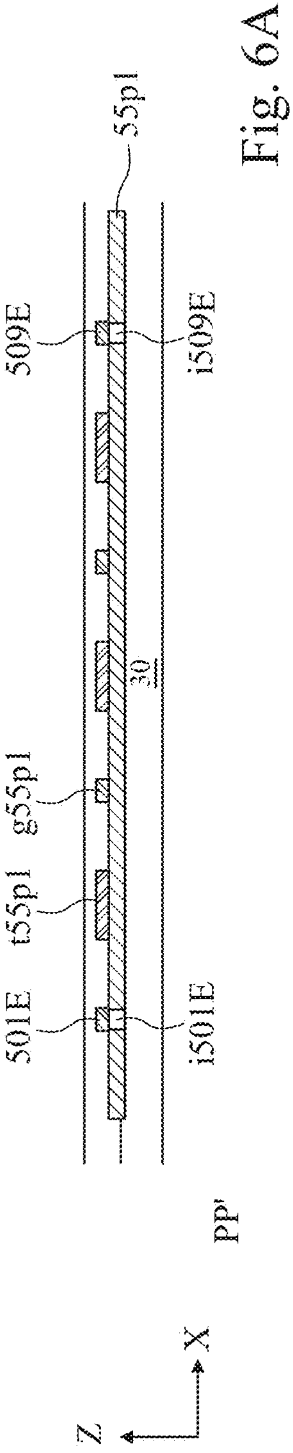
FIGS. 6A-6B are cross-sectional views of the NMOS active-region structures in the padding area of the device in FIG. 2B, in accordance with some embodiments.
Figure 6B:
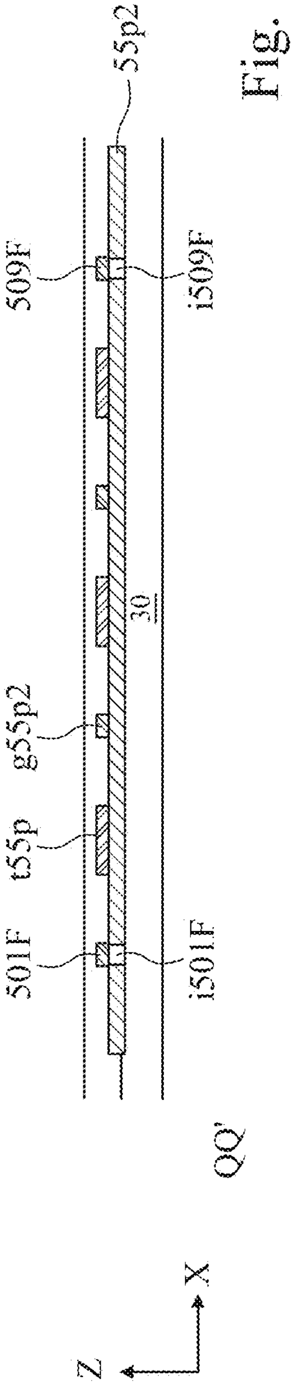

In the embodiments as shown in FIGS. 5E-5F, transistors are not implemented in the PMOS active-region structure 55*p*1 and the PMOS active-region structure 55*p*2 within the first circuit region containing the IO-functional circuits. In some alternative embodiments, as shown in FIGS. 6A-6B, PMOS transistors are implemented in the PMOS active-region structure 55*p*1 and the PMOS active-region structure 55*p*2 within the first circuit region. In some embodiments, at least some of the PMOS transistors in the PMOS active-region structure 55*p*1 and the PMOS active-region structure 55*p*2 are used as header switches or footer switches for some of the IO-functional circuits 110B-140B. In some embodiments, at least some of the PMOS transistors in the PMOS active-region structure 55*p*1 and the PMOS active-region structure 55*p*2 are used as header switches or footer switches for some of the bit-cells in the memory unit $U_B$.

In FIG. 6A, which is the cross-sectional view along the cutting plane PP' of FIG. 2B, the PMOS active-region structure 55*p*1 is on the substrate 30. Various gate-conductors (e.g., g55*p*1) intersect the PMOS active-region structure 55*p*1, and at least one of the gate-conductors forms a gate terminal of a PMOS transistor. Various terminal-conductors (e.g., t55*p*1) intersect the PMOS active-region structure 55*p*1, and at least one of the terminal-conductors forms a source terminal or a drain terminal of a PMOS transistor. In some embodiments, the active regions in the PMOS active-region structure 55*p*1 are isolated from the active regions in the adjacent circuit cells by a boundary isolation region i501E under a dummy gate-conductor 501E and a boundary isolation region i509E under a dummy gate-conductor 509E.

In FIG. 6B, which is the cross-sectional view along the cutting plane QQ' of FIG. 2B, the PMOS active-region structure 55*p*2 is on the substrate 30. Various gate-conductors (e.g., g55*p*2) intersect the PMOS active-region structure 55*p*2, and at least one of the gate-conductors forms a gate terminal of a PMOS transistor. Various terminal-conductors (e.g., t55*p*2) intersect the PMOS active-region structure 55*p*2, and at least one of the terminal-conductors forms a source terminal or a drain terminal of a PMOS transistor. In some embodiments, the active regions in the PMOS active-region structure 55*p*2 are isolated from the active regions in the adjacent circuit cells by a boundary isolation region i501F under a dummy gate-conductor 501F and a boundary isolation region i509F under a dummy gate-conductor 509F.

Figure 7A:
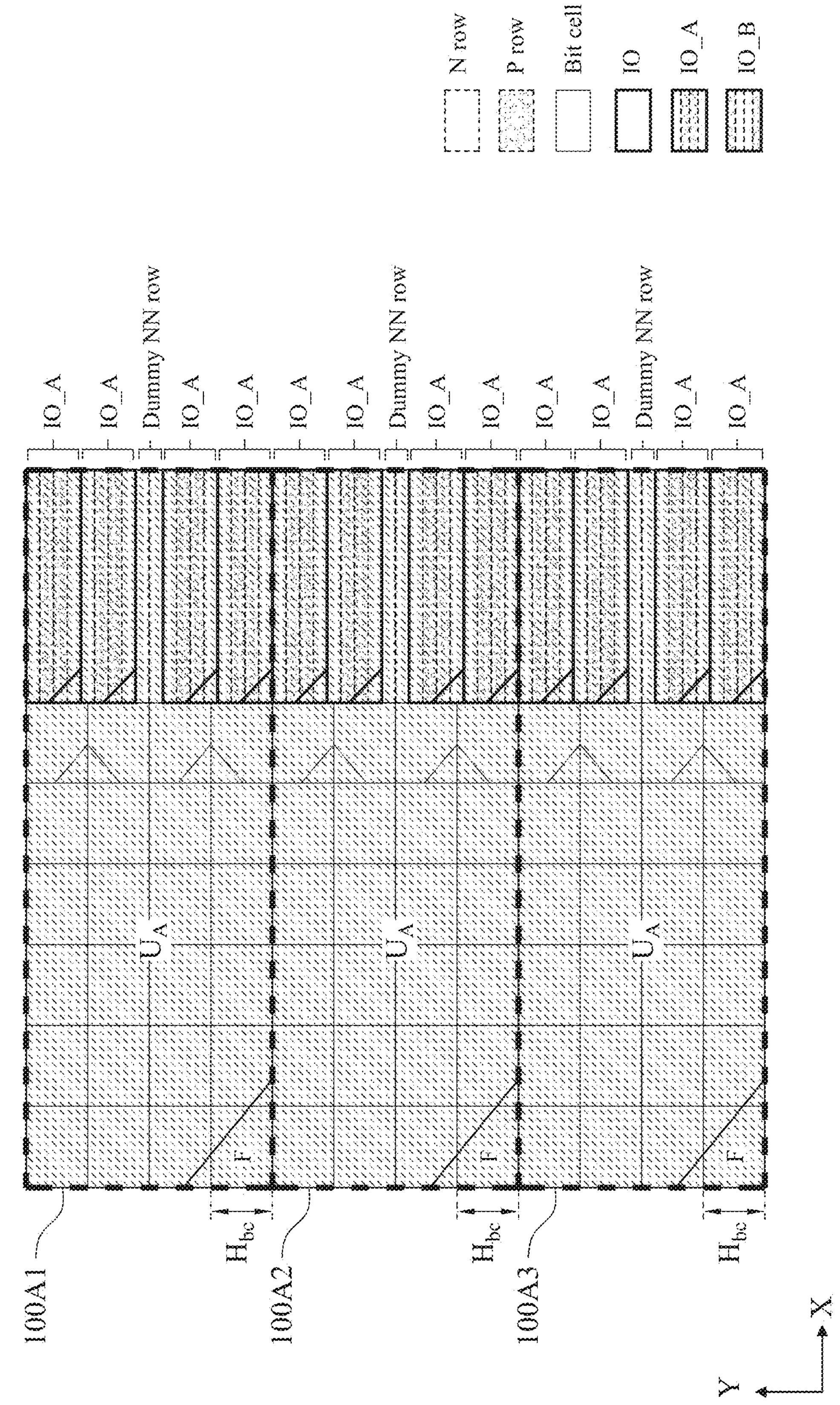
FIGS. 7A-7B and FIGS. 8A-8B are schematics of memory storage devices each having three memory units, in accordance with some embodiments.
Figure 7B:
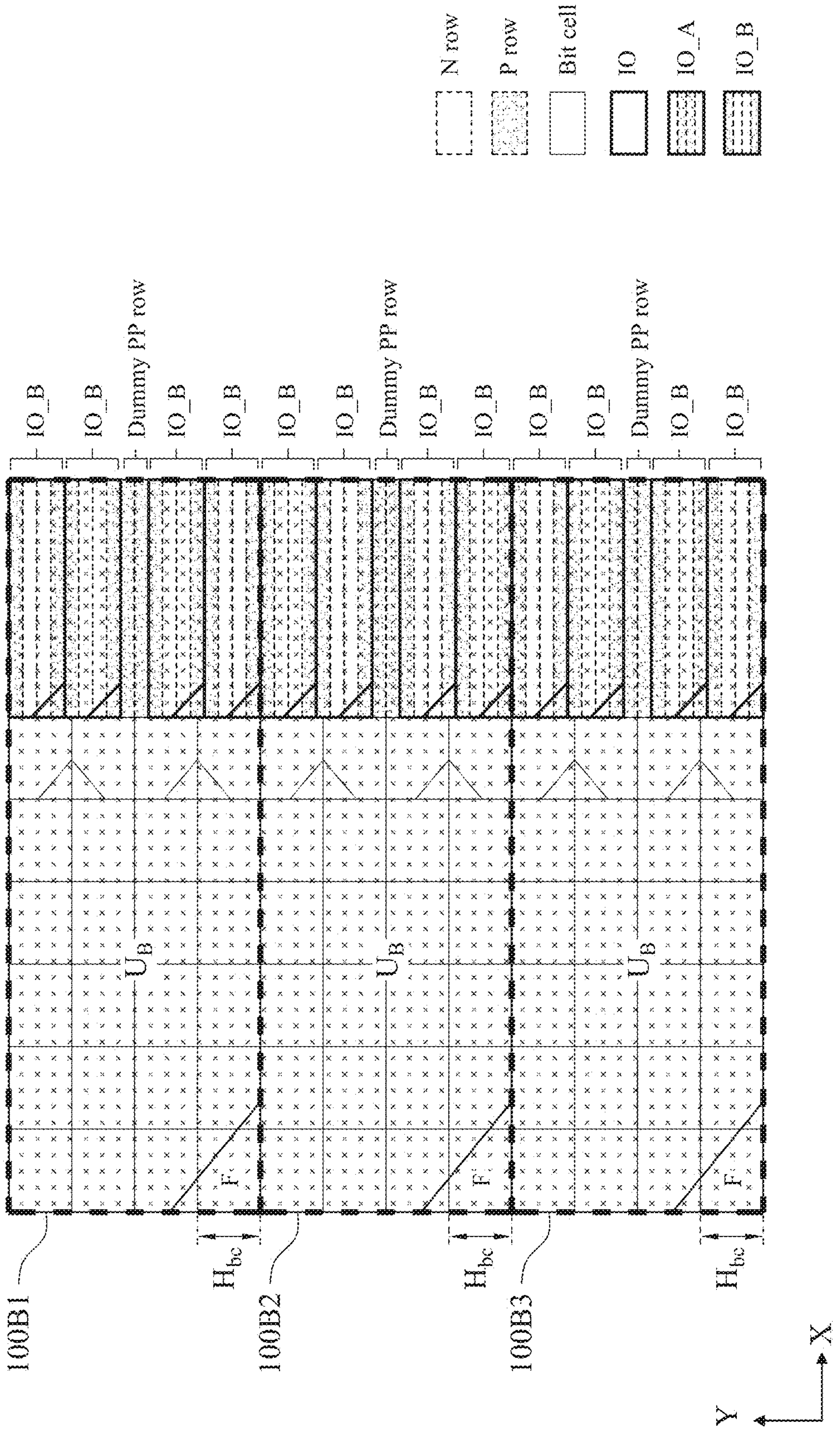
Figure 8A:
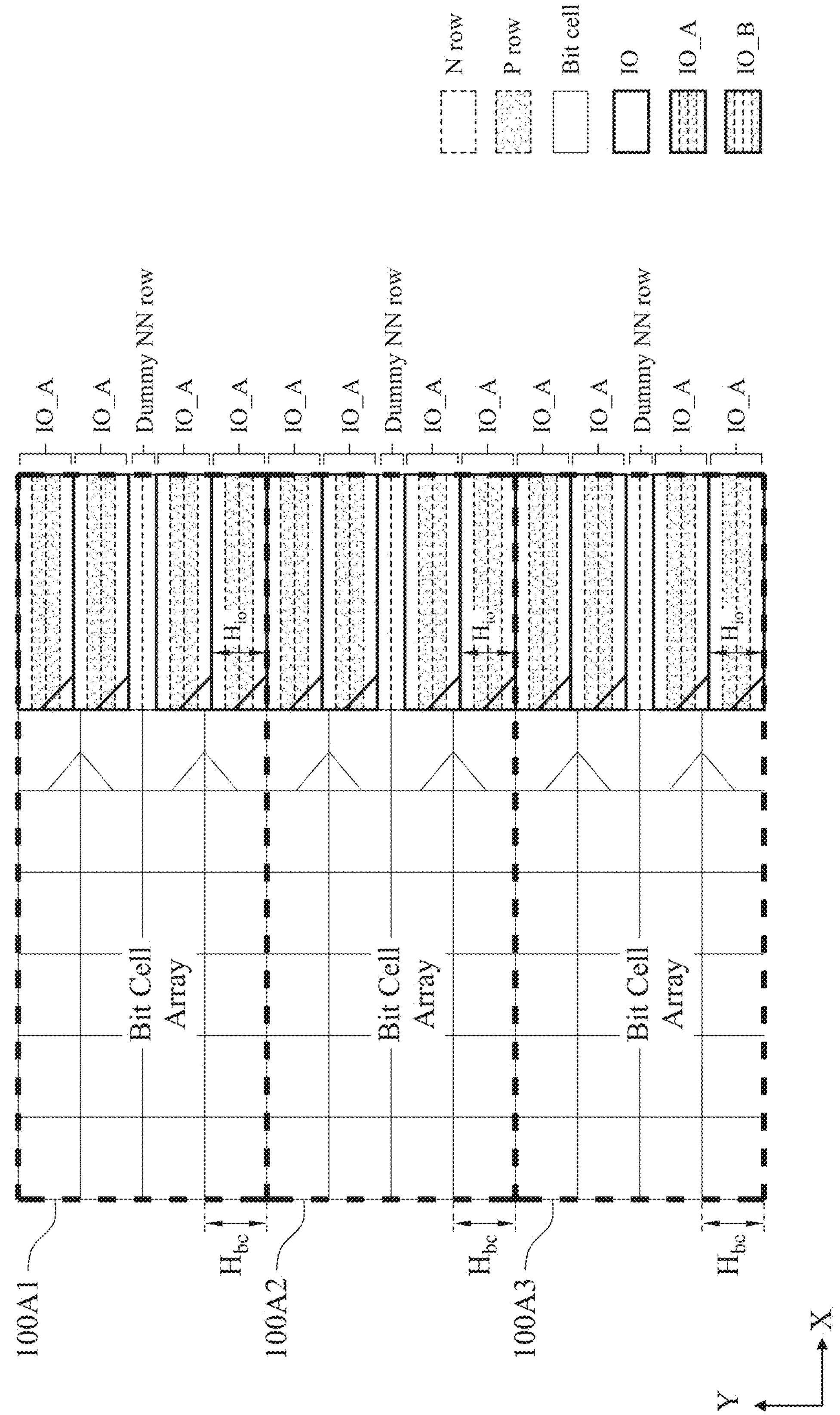

In some embodiments, as shown in FIGS. 7A-7B and FIGS. 8A-8B, a memory storage device includes multiple memory units $U_A$ of FIG. 1A or multiple memory units UB of FIG. 1B. The memory storage device in FIG. 7A includes three memory units 100A1, 100A2, and 100A3 arranged along the Y-direction. Each of the three memory units 100A1, 100A2, and 100A3 has the same schematic circuit design and has the same layout as the memory units $U_A$ of FIG. 1A. The memory storage device in FIG. 7A is shown in more detail in FIG. 8A. Like the memory units $U_A$ of FIG. 1A, each of the three memory units 100A1, 100A2, and 100A3, as shown in FIG. 8A, includes four arrays of bit-cells and four IO-functional circuits. Each array of bit-cells is associated with a corresponding IO-functional circuit.

In each memory unit (i.e., 100A1, 100A2, or 100A3), the four IO-functional circuits are aligned with each other in a first circuit region, while the four arrays of bit-cells are aligned with each other in a second circuit region. In each of the three memory units, a padding area in the first circuit region is implemented with two NMOS active-region structures. Two of the IO-functional circuits are at a first side of the padding area having the two NMOS active-region structures, and the other two of the IO-functional circuits are at a second side of the padding area having the two NMOS active-region structures. In some embodiments, NMOS transistors are implemented in the two NMOS active-region structures of the padding area as header switches or footer switches for the memory unit. In some embodiments, the two NMOS active-region structures of the padding area are not implemented with functioning transistors.

Figure 8B:
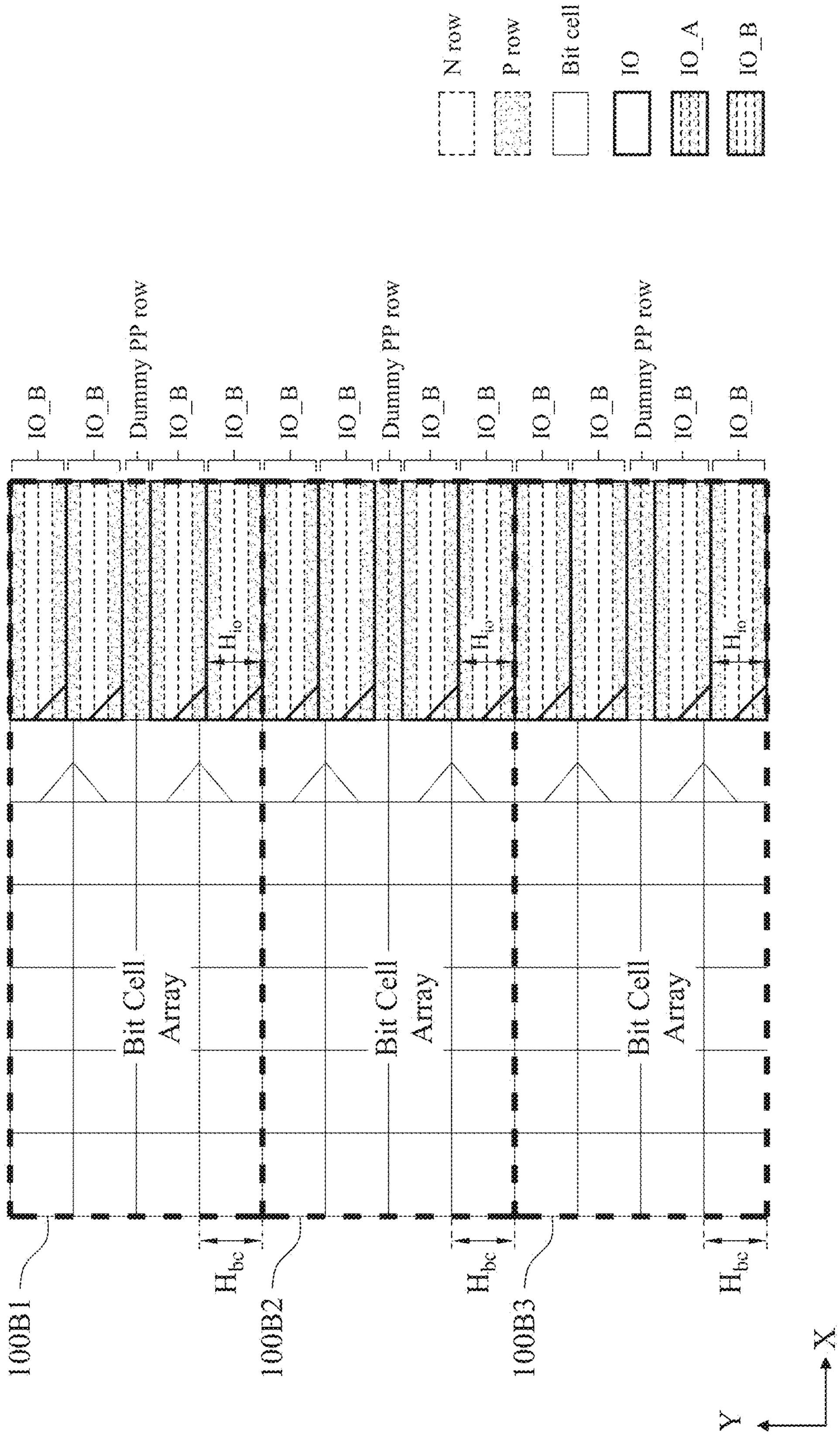

The memory storage device in FIG. 7B includes three memory units 100B1, 100B2, and 100B3 arranged along the Y-direction. Each of the three memory units 100B1, 100B2, and 100B3 has the same schematic circuit design and has the same layout as the memory units $U_B$ of FIG. 1B. The memory storage device in FIG. 7B is shown in more detail in FIG. 8B. Like the memory units $U_B$ of FIG. 1B, each of the three memory units 100B1, 100B2, and 100B3, as shown in FIG. 8B, includes four arrays of bit-cells and four IO-functional circuits. Each array of bit-cells is associated with a corresponding IO-functional circuit.

In each memory unit (i.e., 100B1, 100B2, or 100B3), the four IO-functional circuits are aligned with each other in a first circuit region, while the four arrays of bit-cells are aligned with each other in a second circuit region. In each of the three memory units, a padding area in the first circuit region is implemented with two PMOS active-region structures. Two of the IO-functional circuits are at a first side of the padding area having the two PMOS active-region structures, and the other two of the IO-functional circuits are at a second side of the padding area having the two PMOS active-region structures. In some embodiments, PMOS transistors are implemented in the two PMOS active-region structures of the padding area as header switches or footer switches for the memory unit. In some embodiments, the two PMOS active-region structures of the padding area are not implemented with functioning transistors.

Figure 9B:
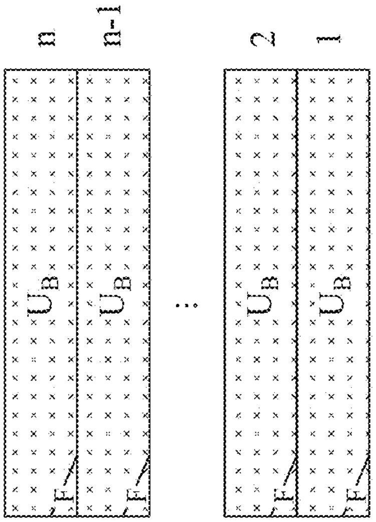
FIGS. 9A-9B are schematics of memory storage devices each having an integer number of memory units, in accordance with some embodiments.
Figure 9A:
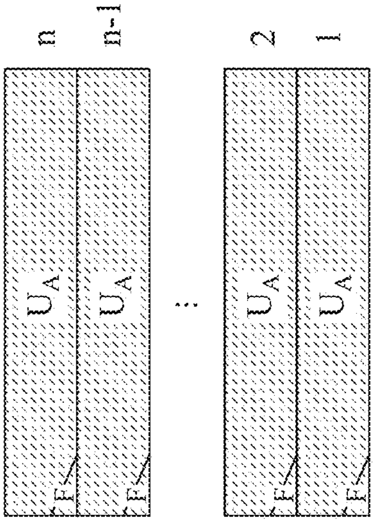

The memory storage devices in FIGS. 7A-7B and FIGS. 8A-8B are provided as examples. In some embodiments, a memory storage device includes more than three memory units. For example, in FIG. 9A, a memory storage device includes multiple memory units $U_A$ of FIG. 1A, and the number of memory units $U_A$ is an integer n (which is larger than three). In FIG. 9B, a memory storage device includes multiple memory units $U_B$ of FIG. 1B, and the number of memory units $U_B$ is an integer n (which is larger than three).

Figure 10B:
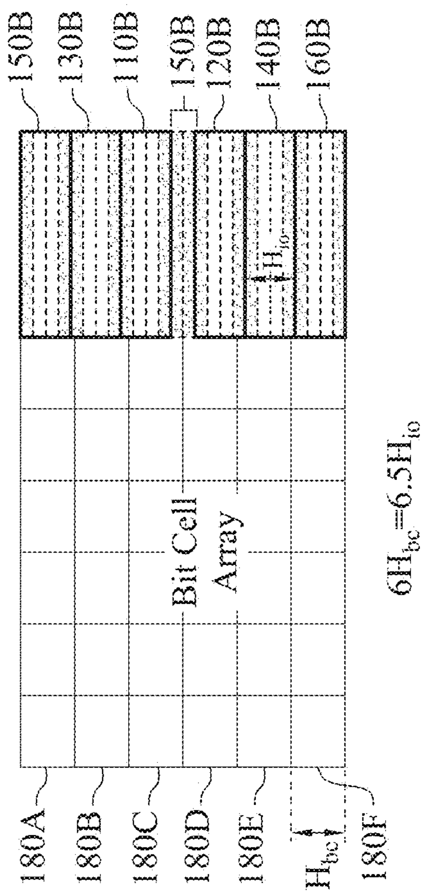
FIGS. 10A-10B are schematics of memory units, in accordance with some embodiments.
Figure 10A:
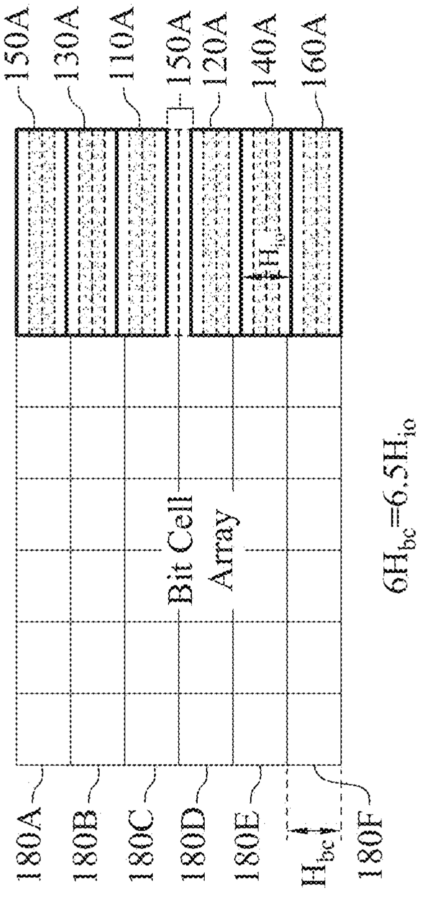

The memory unit $U_A$ in FIG. 1A and the memory unit $U_B$ in FIG. 1B are provided as examples. Each of the memory units $U_A$ and $U_B$ in FIGS. 1A-1B has four arrays of bit-cells arranged in four rows. The height $H_{bc}$ of an array of bit-cells is larger than the height $H_{io}$ of an IO-functional circuit. The ratio between the height $H_{bc}$ and the height $H_{io}$ is 9/8, which corresponds to the equation $4H_{bc}=4.5H_{io}$ and the height of the padding area (e.g., 150A or 150B) is $0.5H_{io}$. In some alternative embodiments, each of the memory units $U_A$ and $U_B$ in FIGS. 10A-10B includes six arrays of bit-cells 180A-180F arranged in six rows. Each of the memory units $U_A$ and $U_B$ in FIGS. 10A-10B includes six IO-functional circuits (e.g., 110A-160A or 110B-160B). The height of the padding area (e.g., 150A or 150B) is still $0.5H_{io}$. In FIGS. 10A-10B, the ratio between the height $H_{bc}$ and the height $H_{io}$ is 13/12, which corresponds to the equation $6H_{bc}=6.5H_{io}$. The memory units with four arrays of bit-cells or six arrays of bit-cells are provided as examples. The memory units with other integer number of arrays of bit-cells are within the contemplated scope of present disclosure.

In a memory unit (such, $U_A$ in FIG. 1A, $U_B$ in FIG. 1B, $U_A$ in FIG. 10A, or $U_B$ in FIG. 10B), each array of bit-cells is associated with a corresponding IO-functional circuit, or equivalently each IO-functional circuit is associated with a corresponding array of bit-cells. Each IO-functional circuit is coupled to the bit-cells in the corresponding array of bit-cells though one or more conducting lines. An IO-functional circuit is a circuit connected to an array of bit-cells and configured to transmit signals to and/or receive signals from the array of bit-cells through one or more conducting lines which are connected to the bit-cells in the array of bit-cells. Examples of IO-functional circuits include word line drivers, pre-charge drivers, sense amplifiers, and read-write selection drivers.

Figure 11A:
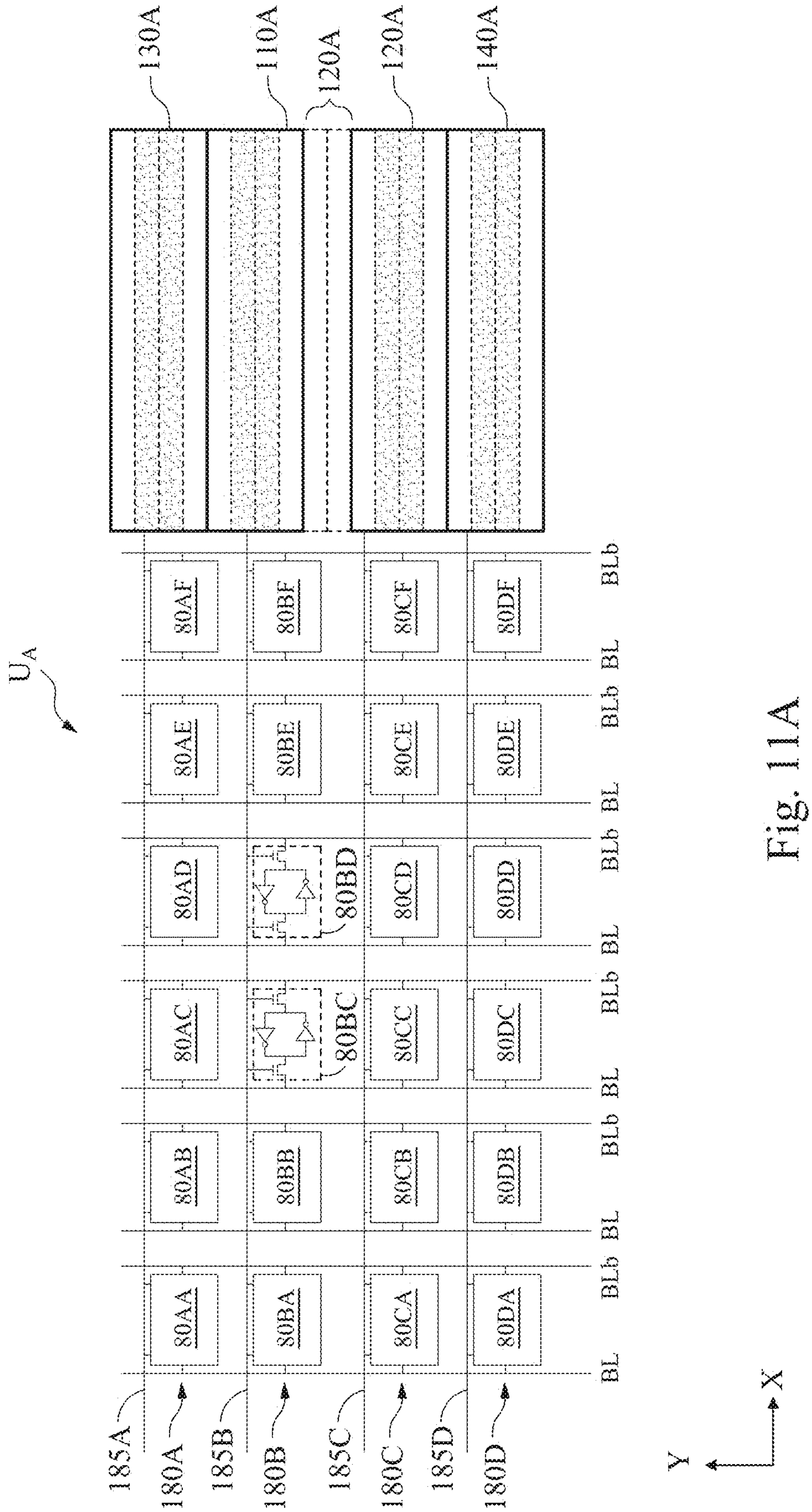
FIGS. 11A-11B are schematics of memory units having conducting lines which connect IO-functional circuits with arrays of bit-cells, in accordance with some embodiments.
Figure 11B:
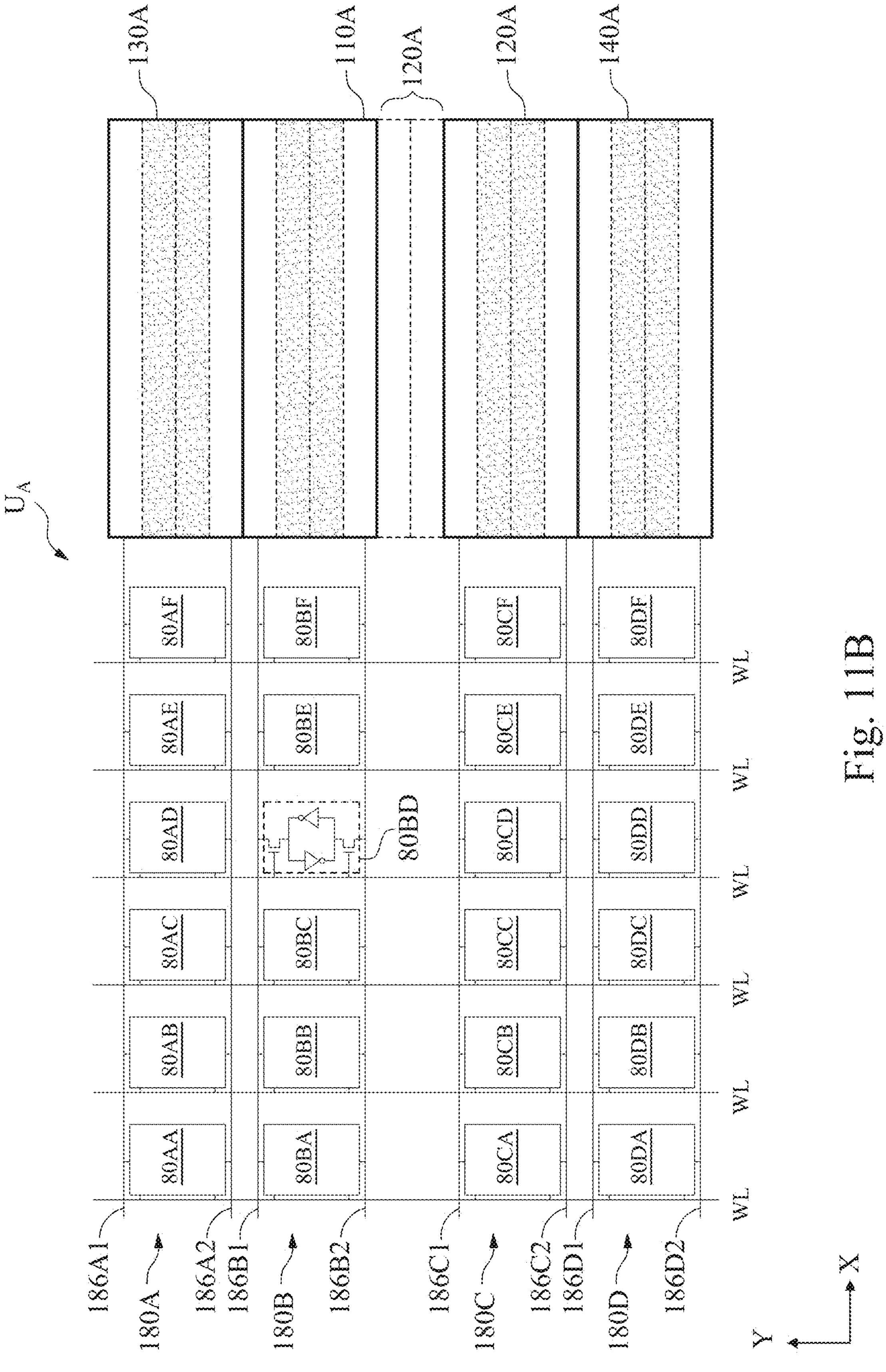

FIGS. 11A-11B are schematics of memory units having conducting lines which connect IO-functional circuits with arrays of bit-cells, in accordance with some embodiments. In FIGS. 11A-11B, the memory units $U_A$ includes four IO-functional circuits 110A-140A and four arrays of bit-cells 180A-180D. The array of bit-cells 180A includes six bit-cells 80AA-80AF, the array of bit-cells 180B includes six bit-cells 80BA-80BF, the array of bit-cells 180C includes six bit-cells 80CA-80CF, and the array of bit-cells 180D includes six bit-cells 80DA-80DF. An example implementation of each bit-cell in FIGS. 11A-11B is a one-port six-transistor SRAM cell. Two of the bit-cells (i.e., 80BC and 80DB) in FIG. 11A are shown in more detail, and one of the bit-cells (i.e., 80DB) in FIG. 11B is shown in more detail. Other implementations of the bit-cells in FIGS. 11A-11B are within the contemplated scope of present disclosure.

In FIG. 11A, the memory unit $U_A$ includes four conducting lines 185A-185D extending in the X-direction. Each of the six bit-cells 80AA-80AF in the array of bit-cells 180A is connected to the conducting lines 185A which is further connected to the IO-functional circuit 130A. Each of the six bit-cells 80BA-80BF in the array of bit-cells 180B is connected to the conducting lines 185B which is further connected to the IO-functional circuit 110A. Each of the six bit-cells 80CA-80CF in the array of bit-cells 180C is connected to the conducting lines 185C which is further connected to the IO-functional circuit 120A. Each of the six bit-cells 80AD-80DF in the array of bit-cells 180D is connected to the conducting lines 185D which is further connected to the IO-functional circuit 140A.

In FIG. 11A, each of the four conducting lines 185A-185D extending in the X-direction is a word line, and each of the four IO-functional circuits 110A-140A is a word line driver. Each column of the bit-cells is connected to a corresponding pair of bit lines BL and BLb. A voltage transmitted to a word line from a word line driver is applied to a corresponding row of bit-cells (which is connected to the word line), and the voltage on the word line determines whether each bit-cell in the corresponding row of bit-cells is in a read/write mode or in a storage mode. In a read mode, the latching state of a bit-cell is detected based on the voltage/current appeared on the corresponding pair of bit lines BL and BLb coupled to the bit-cell. In a write mode, the latching state of a bit-cell is set with the voltage/current applied to the corresponding pair of bit lines BL and BLb coupled to the bit-cell. In a storage mode, the latching state of a bit-cell is maintained, as the internal latching circuit in the bit-cell is electrically isolated from the corresponding pair of bit lines BL and BLb connected to the bit-cell.

In FIG. 11B, the memory unit $U_A$ includes four pairs of conducting lines 186A1-186A2, 186B1-186B2, 186C1-186C2, and 186D1-186D2. Each conducting line extends in the X-direction. Each of the six bit-cells 80AA-80AF in the array of bit-cells 180A is connected to the pair of conducting lines 186A1-186A2 which are further connected to the IO-functional circuit 130A. Each of the six bit-cells 80BA-80BF in the array of bit-cells 180B is connected to the pair of conducting lines 186B1-186B2 which are further connected to the IO-functional circuit 110A. Each of the six bit-cells 80CA-80CF in the array of bit-cells 180C is connected to the pair of conducting lines 186C1-186C2 which are further connected to the IO-functional circuit 120A. Each of the six bit-cells 80AD-80DF in the array of bit-cells 180D is connected to the pair of conducting lines 186D1-186D2 which are further connected to the IO-functional circuit 140A.

In FIG. 11B, each of the four pairs of conducting lines extending in the X-direction is a pair of bit lines BL and BLb. The pair of conducting lines 186A1-186A2 is a pair of bit lines for the array of bit-cells 180A, the pair of conducting lines 186B1-186B2 is a pair of bit lines for the array of bit-cells 180B, the pair of conducting lines 186C1-186C2 is a pair of bit lines for the array of bit-cells 180C, and the pair of conducting lines 186D1-186D2 is a pair of bit lines for the array of bit-cells 180D. Each of the IO-functional circuits 110A-140A, which is connected to a corresponding pair of bit lines, includes therein a sense amplifier and/or a precharge driver.

In the embodiment as shown in FIG. 11A, each of the four arrays of bit-cells (i.e., 180A, 180B, 180C, or 180D) is connected to a conducting line which functions as a word line, and the corresponding IO-functional circuit connected to the conducting line includes therein a word line driver. In some alternative embodiments, each of the four arrays of bit-cells (i.e., 180A, 180B, 180C, or 180D) is connected to two conducting lines extending in the X-direction. The two conducting lines connected to each array of bit-cells are also connected to a corresponding IO-functional circuit (i.e., one of the four IO-functional circuits 110A-140A). One of the two conducting lines functions as a word line, and the other one of the two conducting lines functions as a read-write selection line. The corresponding IO-functional circuit connected to the two conducting lines includes therein a word line driver and/or a read-write selection driver. Each bit-cell in an array of bit-cells has a port connected to a word line and a port connected to a read-write selection line. A voltage transmitted to a read-write selection line from a read-write selection driver determines whether each bit-cell in a corresponding row of bit-cells is in a read mode or in a write mode. A voltage transmitted to a word line from a word line driver determines whether each bit-cell in a corresponding row of bit-cells is enabled for a read/write mode.

Figure 12:
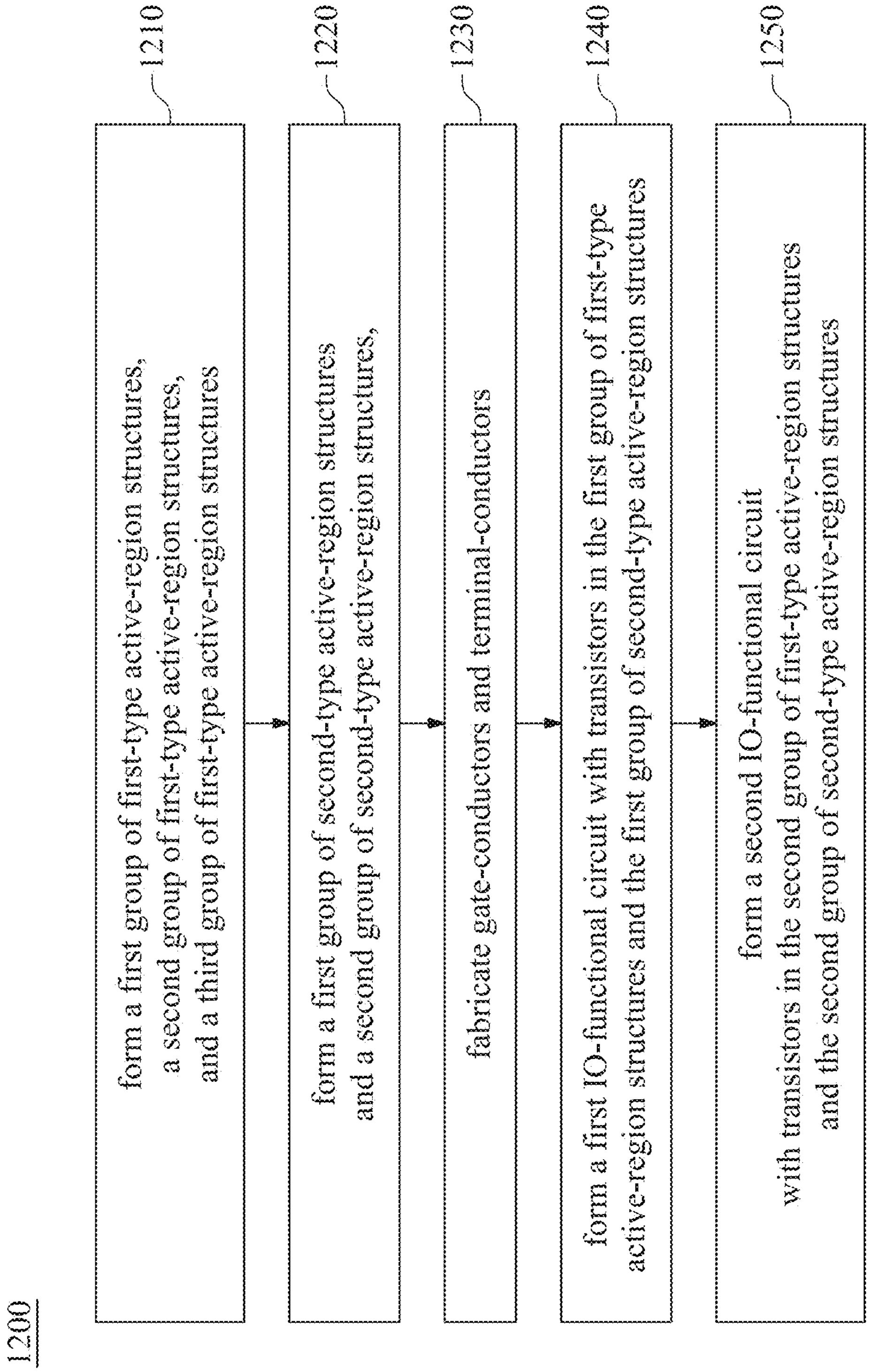
FIG. 12 is a flowchart of a method 1200 of manufacturing an integrated circuit, in accordance with some embodiments.

FIG. 12 is a flowchart of a method 1200 of manufacturing an integrated circuit, in accordance with some embodiments. The sequence in which the operations of method 1200 are depicted in FIG. 12 is for illustration only; the operations of method 1200 are capable of being executed in sequences that differ from that depicted in FIG. 12A. It is understood that additional operations may be performed before, during, and/or after the method 1200 depicted in FIG. 12A, and that some other processes may only be briefly described herein.

In operation 1210 of method 1200, a first group of first-type active-region structures, a second group of first-type active-region structures, and a third group of first-type active-region structures are formed on the substrate. Each first-type active-region structure extends in the X-direction. The third group of first-type active-region structures is adjacent to a first first-type active-region structure in the first group of first-type active-region structures and adjacent to a second first-type active-region structure in the second group of first-type active-region structures. In the embodiment as shown in FIG. 2A and FIGS. 3A-3F, the first group of first-type active-region structures includes the NMOS active-region structures 52*n* and 54*n* in the IO-functional circuit 110A, the second group of first-type active-region structures includes the NMOS active-region structures 52*n* and 54*n* in the IO-functional circuit 120A, and the third group of first-type active-region structures includes the NMOS active-region structures 55*n*1 and 55*n*2 in the padding area 150A. In the embodiment as shown in FIG. 2B and FIGS. 5A-5F, the first group of first-type active-region structures includes the PMOS active-region structures 52*p* and 54*p* in the IO-functional circuit 110B, the second group of first-type active-region structures includes the PMOS active-region structures 52*p* and 54*p* in the IO-functional circuit 120B, and the third group of first-type active-region structures includes the PMOS active-region structures 55*p*1 and 55*p*2 in the padding area 150B.

In operation 1220 of method 1200, a first group of second-type active-region structures and a second group of second-type active-region structures are formed on the substrate. Each second-type active-region structure extends in the X-direction. The second group of first-type active-region structures and the second group of second-type active-region structures are separated from the first group of first-type active-region structures and the first group of second-type active-region structures by a padding area having therein the third group of first-type active-region structures. In the embodiment as shown in FIG. 2A, the first group of second-type active-region structures includes the PMOS active-region structures 52*p* and 54*p* in the IO-functional circuit 110A, and the second group of second-type active-region structures includes the PMOS active-region structures 52*p* and 54*p* in the IO-functional circuit 120A. In the embodiment as shown in FIG. 2B, the first group of second-type active-region structures includes the NMOS active-region structures 52*n* and 54*n* in the IO-functional circuit 110B, and the second group of second-type active-region structures includes the NMOS active-region structures 52*n* and 54*n* in the IO-functional circuit 120B.

In operation 1230 of method 1200, gate-conductors and terminal-conductors are fabricated. Some of the gate-conductors intersect with one or more active-region structures and form gate terminals of various transistors. Some of the terminal-conductors intersect with one or more active-region structures and form source terminals or drain terminals of various transistors. In the embodiment as shown in FIG. 3A-3F or 5A-5F, the cross sections of various gate-conductors and terminal-conductors intersecting active-region structures are depicted.

In operation 1240 of method 1200, a first IO-functional circuit is formed with transistors in the first group of first-type active-region structures and the first group of second-type active-region structures are formed. In the embodiment as shown in FIG. 2A, the IO-functional circuit 110A is formed with the NMOS transistors in the NMOS active-region structures 52*n* and 54*n* and the PMOS transistors in the PMOS active-region structures 52*p* and 54*p*.

In operation 1250 of method 1200, a second IO-functional circuit is formed with transistors in the second group of first-type active-region structures and the second group of second-type active-region structures. In the embodiment as shown in FIG. 2A, the IO-functional circuit 120A is formed with the NMOS transistors in the NMOS active-region structures 52*n* and 54*n* and the PMOS transistors in the PMOS active-region structures 52*p* and 54*p*.

Figure 13:
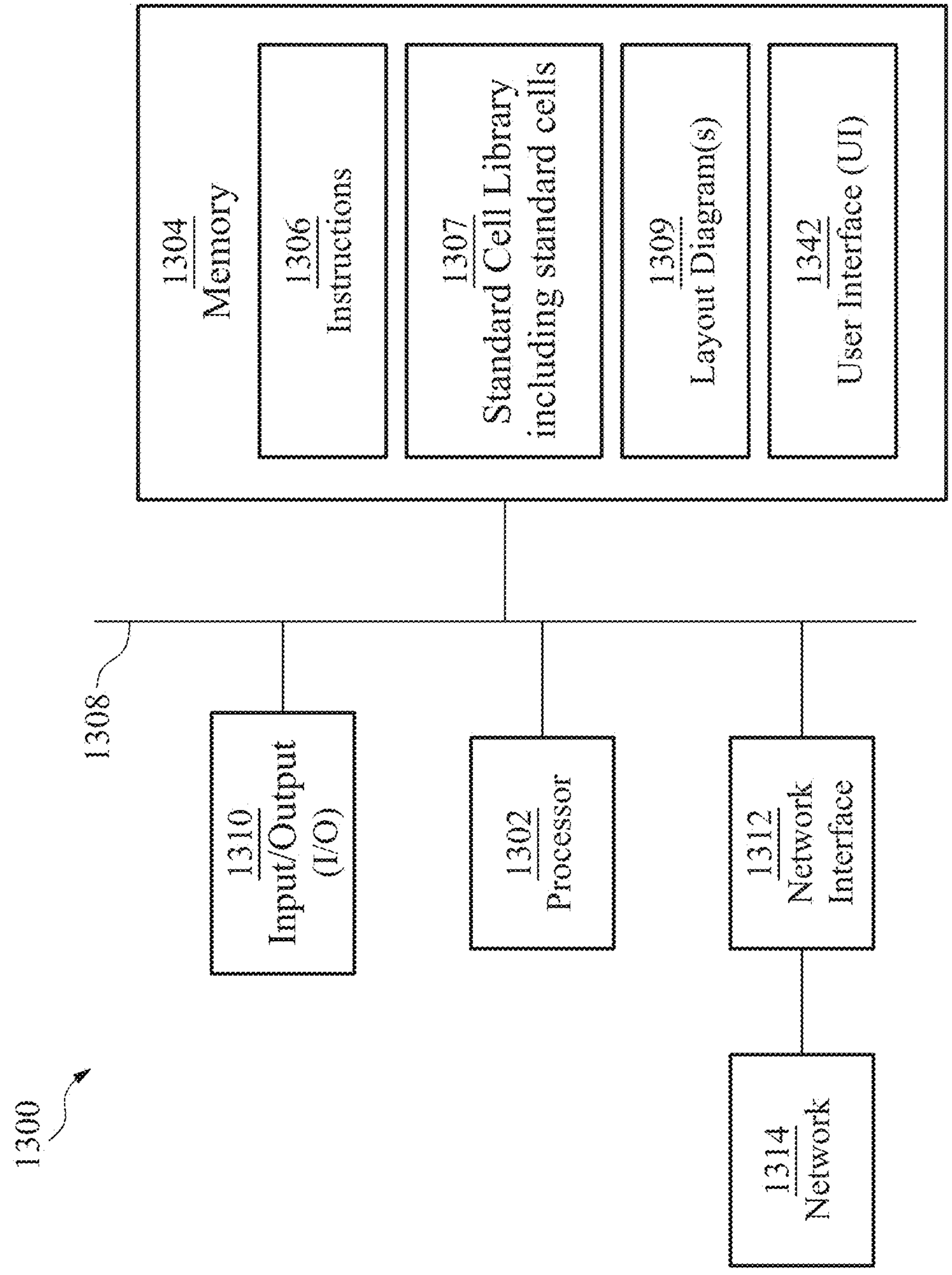
FIG. 13 is a block diagram of an electronic design automation (EDA) system in accordance with some embodiments.

FIG. 13 is a block diagram of an electronic design automation (EDA) system 1300 in accordance with some embodiments.

In some embodiments, EDA system 1300 includes an automatic placement and routing (APR) system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Computer-readable Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, computer-readable storage medium 1304 stores computer program code 1306 configured to cause EDA system 1300 (where such execution represents (at least in part) the EDA tool) to be usable for performing a portion or all of the noted processes and/or methods. In one or more embodiments, computer-readable storage medium 1304 also stores information which facilitates performing a portion or all of the noted processes and/or methods. In one or more embodiments, computer-readable storage medium 1304 stores library 1307 of standard cells including such standard cells as disclosed herein. In one or more embodiments, computer-readable storage medium 1304 stores one or more layout diagrams 1309 corresponding to one or more layouts disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

EDA System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a user interface (UI) through I/O interface 1310. The information is stored in computer-readable medium 1304 as UI 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
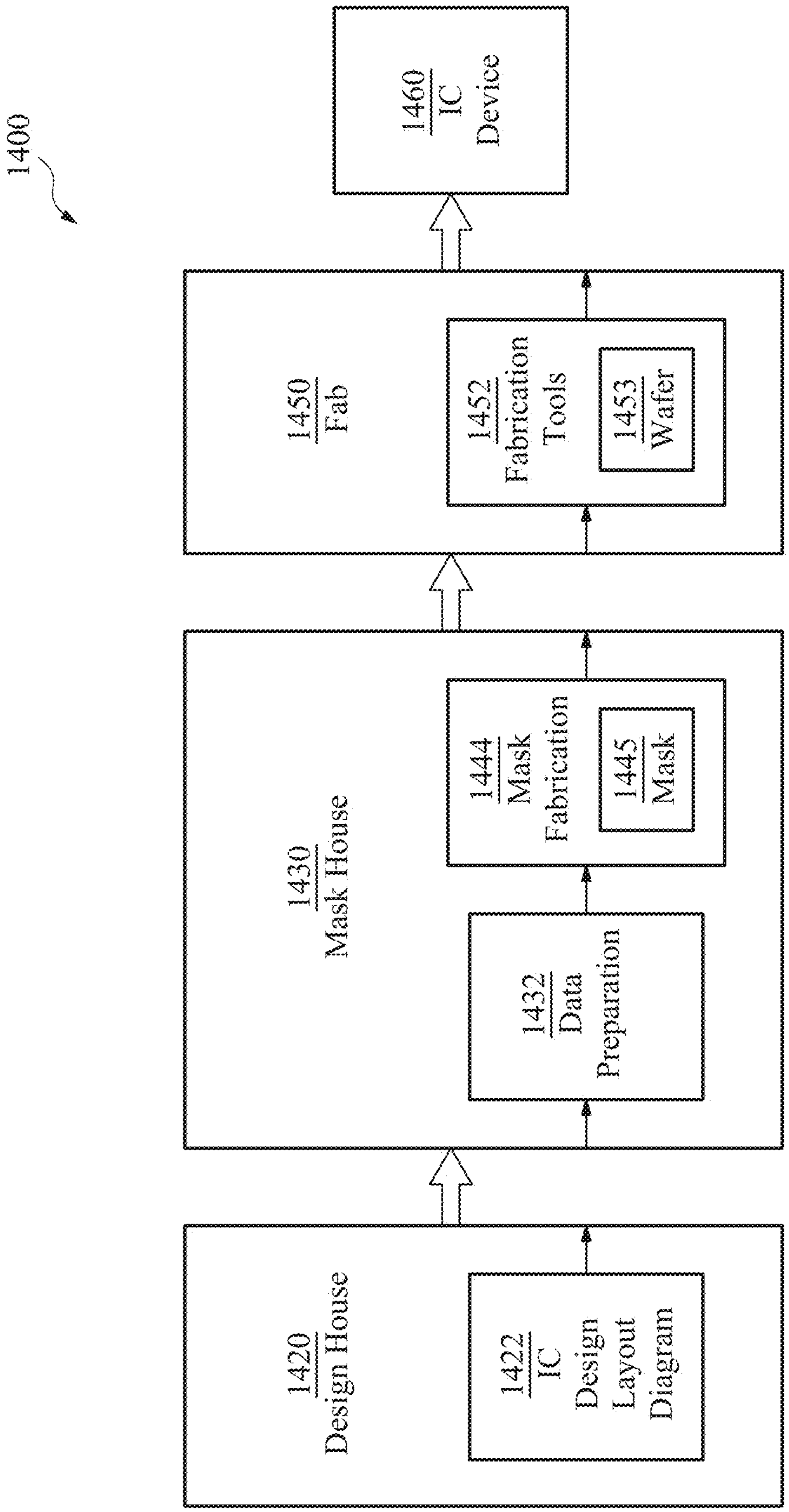
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator (fab) 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 are owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes mask data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file (RDF). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for photolithographic implementation effects during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1422.

It should be understood that the above description of mask data preparation 1432 has been simplified for the purposes of clarity. In some embodiments, mask data preparation 1432 includes additional features such as a logic operation (LOP) to modify the IC design layout diagram 1422 according to manufacturing rules. Additionally, the processes applied to IC design layout diagram 1422 during mask data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multilevel interconnects, and the like (formed at subsequent manufacturing steps).

An aspect of the present disclosure relates to an integrated circuit. The integrated circuit includes a first group of first-type active-region structures each extending in a first direction; a first group of second-type active-region structures each extending in the first direction, a second group of first-type active-region structures each extending in the first direction, a second group of second-type active-region structures each extending in the first direction. The circuit also includes a third group of first-type active-region structures each extending in the first direction, where the first group of first-type active-region structures and the first group of second-type active-region structures are separated from the second group of first-type active-region structures and the second group of second-type active-region structures along a second direction by the third group of first-type active-region structures, where the second direction is perpendicular to the first direction, and where the third group of first-type active-region structures is adjacent to a first-type active-region structure in the first group of first-type active-region structures and adjacent to a first-type active-region structure in the second group of first-type active-region structures; a first IO-functional circuit having first-type transistors in the first group of first-type active-region structures and having second-type transistors in the first group of second-type active-region structures, and a second IO-functional circuit having first-type transistors in the second group of first-type active-region structures and having second-type transistors in the second group of second-type active-region structures.

Another aspect of the present disclosure also relates to an integrated circuit. The integrated circuit includes a first group of first-type active-region structures each extending in a first direction; a first group of second-type active-region structures each extending in the first direction, a first IO-functional circuit having first-type transistors in the first group of first-type active-region structures and having second-type transistors in the first group of second-type active-region structures, a second group of first-type active-region structures each extending in the first direction, a second group of second-type active-region structures each extending in the first direction, a second IO-functional circuit having first-type transistors in the second group of first-type active-region structures and having second-type transistors in the second group of second-type active-region structures. The circuit also includes a third group of first-type active-region structures each extending in the first direction, where the first IO-functional circuit is separated from the second IO-functional circuit along a second direction by the third group of first-type active-region structures, where the second direction is perpendicular to the first direction, and where the third group of first-type active-region structures is adjacent to a first-type active-region structure in the first group of first-type active-region structures and adjacent to a first-type active-region structure in the second group of first-type active-region structures.

Another aspect of the present disclosure relates to a method of fabricating an integrated circuit. The method includes forming a first group of first-type active-region structures, a second group of first-type active-region structures, and a third group of first-type active-region structures, where the third group of first-type active-region structures is adjacent to a first first-type active-region structure in the first group of first-type active-region structures and adjacent to a second first-type active-region structure in the second group of first-type active-region structures. The method also includes forming a first group of second-type active-region structures and a second group of second-type active-region structures, where the second group of first-type active-region structures and the second group of second-type active-region structures are separated from the first group of first-type active-region structures and the first group of second-type active-region structures by a padding area having therein the third group of first-type active-region structures. The method also includes fabricating gate-conductors and terminal-conductors extending along a second direction, where each active-region structure extends in a first direction which is perpendicular to the second direction. The method also includes forming a first IO-functional circuit with transistors in the first group of first-type active-region structures and the first group of second-type active-region structures. The method also includes forming a second IO-functional circuit with transistors in the second group of first-type active-region structures and the second group of second-type active-region structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:

a first group of first-type active-region structures each extending in a first direction;

a first group of second-type active-region structures each extending in the first direction;

a second group of first-type active-region structures each extending in the first direction;

a second group of second-type active-region structures each extending in the first direction;

a third group of first-type active-region structures each extending in the first direction, wherein the first group of first-type active-region structures and the first group of second-type active-region structures are separated from the second group of first-type active-region structures and the second group of second-type active-region structures along a second direction by the third group of first-type active-region structures, wherein the second direction is perpendicular to the first direction, and wherein the third group of first-type active-region structures is adjacent to a first-type active-region structure in the first group of first-type active-region structures and adjacent to a first-type active-region structure in the second group of first-type active-region structures;

a first input output (IO)-functional circuit having first-type transistors in the first group of first-type active-region structures and having second-type transistors in the first group of second-type active-region structures; and a second IO-functional circuit having first-type transistors in the second group of first-type active-region structures and having second-type transistors in the second group of second-type active-region structures.

2. The integrated circuit of claim 1, wherein:

each transistor in the first IO-functional circuit is either in the first group of first-type active-region structures or in the first group of second-type active-region structures; and each transistor in the second IO-functional circuit is either in the second group of first-type active-region structures or in the second group of second-type active-region structures.

3. The integrated circuit of claim 1, further comprising:

a first array of bit-cells connected to a first conducting line extending in the first direction, wherein the first conducting line is directly connected to the first IO-functional circuit; and a second array of bit-cells connected to a second conducting line extending in the first direction, wherein the second conducting line is directly connected to the second IO-functional circuit.

4. The integrated circuit of claim 3, wherein:

each of the first IO-functional circuit and the second IO-functional circuit is in a circuit cell which has a height along the second direction that is smaller than a height of a bit-cell in the first array of bit-cells or in the second array of bit-cells.

5. The integrated circuit of claim 1, wherein the first IO-functional circuit and the second IO-functional circuit are in a first circuit region, further comprising:

a first array of bit-cells and a second array of bit-cells in a second circuit region which is non-overlapping with the first circuit region;

a first conducting line extending in the first direction which directly connects each bit-cell in the first array of bit-cells to the first IO-functional circuit; and a second conducting line extending in the first direction which directly connects each bit-cell in the second array of bit-cells to the second IO-functional circuit.

6. The integrated circuit of claim 1, wherein:

the third group of first-type active-region structures has a first-type transistor therein configured either as a header switch or as a footer switch coupled between a power supply and the first IO-functional circuit.

7. The integrated circuit of claim 1, wherein:

the third group of first-type active-region structures has a first-type transistor therein configured either as a header switch or as a footer switch coupled between a power supply and the second IO-functional circuit.

8. The integrated circuit of claim 1, wherein:

each first-type transistor is an NMOS transistor; and each second-type transistor is a PMOS transistor.

9. The integrated circuit of claim 1, wherein:

each first-type transistor is a PMOS transistor; and each second-type transistor is an NMOS transistor.

10. The integrated circuit of claim 1, wherein:

the first IO-functional circuit includes a first word line driver; and the second IO-functional circuit includes a second word line driver.

11. The integrated circuit of claim 1, wherein:

the first IO-functional circuit includes a first sense amplifier; and the second IO-functional circuit includes a second sense amplifier.

12. An integrated circuit comprising:

a first group of first-type active-region structures each extending in a first direction;

a first group of second-type active-region structures each extending in the first direction;

a first input output (IO)-functional circuit having first-type transistors in the first group of first-type active-region structures and having second-type transistors in the first group of second-type active-region structures;

a second group of first-type active-region structures each extending in the first direction;

a second group of second-type active-region structures each extending in the first direction;

a second IO-functional circuit having first-type transistors in the second group of first-type active-region structures and having second-type transistors in the second group of second-type active-region structures; and a third group of first-type active-region structures each extending in the first direction, wherein the first IO-functional circuit is separated from the second IO-functional circuit along a second direction by the third group of first-type active-region structures, wherein the second direction is perpendicular to the first direction, and wherein the third group of first-type active-region structures is adjacent to a first-type active-region structure in the first group of first-type active-region structures and adjacent to a first-type active-region structure in the second group of first-type active-region structures.

13. The integrated circuit of claim 12, wherein:

each transistor in the first IO-functional circuit is either in the first group of first-type active-region structures or in the first group of second-type active-region structures; and each transistor in the second IO-functional circuit is either in the second group of first-type active-region structures or in the second group of second-type active-region structures.

14. The integrated circuit of claim 12, wherein each first-type active-region structure is an NMOS active-region structure.

15. The integrated circuit of claim 12, wherein each first-type active-region structure is a PMOS active-region structure.

16. A method comprising:

forming a first group of first-type active-region structures, a second group of first-type active-region structures, and a third group of first-type active-region structures, wherein the third group of first-type active-region structures is adjacent to a first first-type active-region structure in the first group of first-type active-region structures and adjacent to a second first-type active-region structure in the second group of first-type active-region structures;

forming a first group of second-type active-region structures and a second group of second-type active-region structures, wherein the second group of first-type active-region structures and the second group of second-type active-region structures are separated from the first group of first-type active-region structures and the first group of second-type active-region structures by a padding area having therein the third group of first-type active-region structures;

fabricating gate-conductors and terminal-conductors extending along a second direction, wherein each active-region structure extends in a first direction which is perpendicular to the second direction;

forming a first input output (IO)-functional circuit with transistors in the first group of first-type active-region structures and the first group of second-type active-region structures; and forming a second IO-functional circuit with transistors in the second group of first-type active-region structures and the second group of second-type active-region structures.

17. The method of claim 16, further comprising:

forming a first array of bit-cells, wherein each bit-cell in the first array of bit-cells is connected to a first conducting line which is directly connected to the first IO-functional circuit; and forming a second array of bit-cells, wherein each bit-cell in the second array of bit-cells is connected to a second conducting line which is directly connected to the first IO-functional circuit.

18. The method of claim 16, further comprising:

forming a first array of bit-cells, wherein each bit-cell in the first array of bit-cells is connected to a first conducting line extending in the first direction, and wherein the first conducting line is configured to receive signals from the first IO-functional circuit; and forming a second array of bit-cells, wherein each bit-cell in the second array of bit-cells is connected to a second conducting line extending in the first direction, and wherein the second conducting line is configured to receive signals from the second IO-functional circuit.

19. The method of claim 16, further comprising:

forming a first array of bit-cells, wherein each bit-cell in the first array of bit-cells is connected to a first conducting line extending in the first direction, and wherein the first conducting line is configured to transmit signals to the first IO-functional circuit; and forming a second array of bit-cells, wherein each bit-cell in the second array of bit-cells is connected to a second conducting line extending in the first direction, and wherein the second conducting line is configured to transmit signals to the second IO-functional circuit.

20. The method of claim 16, further comprising:

forming each first-type active-region structure in the third group of first-type active-region structures as a dummy active-region structure in the padding area having no transistors therein.

* * * * *